(12) United States Patent
Hirano et al.

(10) Patent No.: US 10,074,722 B2
(45) Date of Patent: Sep. 11, 2018

(54) TRANSISTOR, THIN-FILM TRANSISTOR SUBSTRATE, AND LIQUID CRYSTAL DISPLAY

(71) Applicant: Mitsubishi Electric Corporation, Chiyoda-ku (JP)

(72) Inventors: Rii Hirano, Tokyo (JP); Yusuke Yamagata, Tokyo (JP); Naoki Nakagawa, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/549,834

(22) PCT Filed: Apr. 14, 2016

(86) PCT No.: PCT/JP2016/061978
§ 371 (c)(1),
(2) Date: Aug. 9, 2017

(87) PCT Pub. No.: WO2016/175034
PCT Pub. Date: Nov. 3, 2016

(65) Prior Publication Data
US 2018/0026103 A1 Jan. 25, 2018

(30) Foreign Application Priority Data

Apr. 28, 2015 (JP) ................... 2015-091085

(51) Int. Cl.
*H01L 29/786* (2006.01)
*G02F 1/1368* (2006.01)
(Continued)

(52) U.S. Cl.
CPC ............ *H01L 29/22* (2013.01); *G02F 1/1368* (2013.01); *H01L 27/3262* (2013.01); *H01L 29/7869* (2013.01); *H01L 29/78681* (2013.01)

(58) Field of Classification Search
None
See application file for complete search history.

(56) References Cited

U.S. PATENT DOCUMENTS 5,886,757 A * 3/1999 Song ................. H01L 29/41733
257/59
6,933,529 B2 * 8/2005 Yoo .................. H01L 29/41733
257/113
(Continued)

FOREIGN PATENT DOCUMENTS

JP       2010-212672 A     9/2010
JP       2014-154701 A     8/2014
(Continued)

OTHER PUBLICATIONS

T. Hsieh, et al., "Characterization and Investigation of a Hot-Carrier Effect in Via-Contact Type a-InGaZnO Thin-Film Transistors," IEEE Transactions on Electron Devices, vol. 60, No. 5, May 2013, pp. 1681-1688.
(Continued)

*Primary Examiner* — Eric Ward
(74) *Attorney, Agent, or Firm* — Oblon, McClelland, Maier & Neustadt, L.L.P.

(57) ABSTRACT

The present technique relates to a transistor that uses an oxide semiconductor as its channel layer and that is capable of suppressing fluctuations in threshold voltage, and to a thin-film transistor substrate and a liquid crystal display that include such a transistor. The transistor is configured such that an overlap length, which is a length of overlap in plan view between the source electrode and the channel protective film in a direction from the source electrode toward the drain electrode, is longer than an overlap length, which is a length of overlap in plan view between the drain electrode (Continued)

and the channel protective film in a direction from the drain electrode toward the source electrode.

6 Claims, 11 Drawing Sheets

(51) Int. Cl.
*H01L 29/22* (2006.01)
*H01L 27/32* (2006.01)

(56) References Cited

U.S. PATENT DOCUMENTS

| 8,278,657 | B2 | 10/2012 | Sakata et al. |
| 8,643,009 | B2 | 2/2014 | Sakata et al. |
| 9,018,625 | B2 | 4/2015 | Jeoung |
| 9,069,219 | B2 | 6/2015 | Misaki |
| 9,466,618 | B2 * | 10/2016 | Miyake ............... H01L 27/1225 |
| 2012/0146042 | A1 * | 6/2012 | Kim ..................... H01L 21/268 257/72 |
| 2013/0087781 | A1 * | 4/2013 | Yeh .................. H01L 29/41733 257/43 |
| 2014/0183524 | A1 * | 7/2014 | Jeoung ............... H01L 27/1225 257/43 |
| 2016/0358567 | A1 | 12/2016 | Tomida et al. |

FOREIGN PATENT DOCUMENTS

| JP | 2014-232824 A | 12/2014 |
| JP | 2015-153902 A | 8/2015 |
| WO | 2012/020525 A1 | 2/2012 |
| WO | 2015/122393 A1 | 8/2015 |

OTHER PUBLICATIONS

International Search Report dated Jul. 5, 2016 in PCT/JP2016/061978 filed Apr. 14, 2016.

* cited by examiner

F I G. 2 9
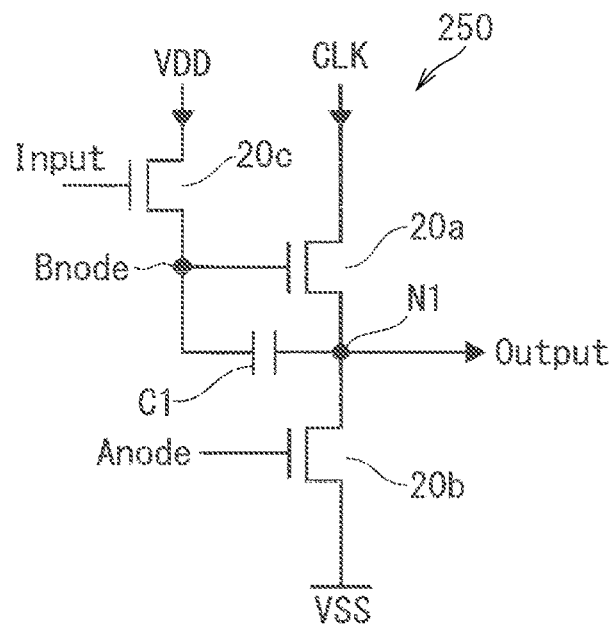
F I G. 3 0
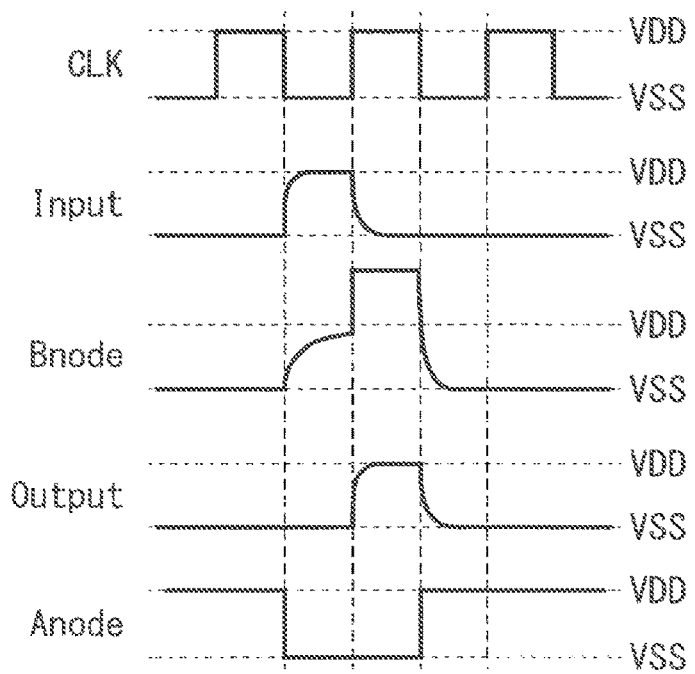

TRANSISTOR, THIN-FILM TRANSISTOR SUBSTRATE, AND LIQUID CRYSTAL DISPLAY

TECHNICAL FIELD

The present technique relates to a transistor, a thin-film transistor substrate, and a liquid crystal display, and in particular to a thin-film transistor and to a thin-film transistor substrate and a liquid crystal display that include such a thin-film transistor.

BACKGROUND ART

Liquid crystal displays (i.e., LCDs), which are one of conventional typical thin panels, are widely used in devices such as monitors for personal computers or mobile data terminal devices by taking advantages of their merits such as low power consumption, small size, and light weight. They also have been widely used in TV applications in recent years.

In general, the display mode of liquid crystal displays is roughly divided into a longitudinal electric field mode typified by a twisted nematic (TN) mode, and a transverse electric field mode typified by an in-plane switching (IPS) mode and a fringe field switching (FFS) mode.

Liquid crystal displays employing the transverse electric field mode feature wide viewing angles and high contrast. Liquid crystal displays employing the IPS mode execute displays upon application of a transverse electric field to liquid crystals, which are sandwiched between opposite substrates, but they cannot adequately drive liquid crystal molecules located immediately above pixel electrodes because the pixel electrodes and common electrodes, to which a transverse electric field is applied, are formed in the same layer. Thus, the liquid crystal displays have low transmittance.

In liquid crystal displays employing the FFS mode, on the other hand, an oblique electric field (fringing field) occurs because common electrodes and pixel electrodes are disposed with an interlayer insulation film sandwiched in between. It is thus possible to sufficiently apply a transverse electric field to even liquid crystal molecules located immediately above the pixel electrodes and to adequately drive these liquid crystal molecules. As a result, the liquid crystal displays can exhibit higher transmittance than the IPS mode liquid crystal displays, as well as having wide viewing angles.

Besides, the liquid crystal molecules in the liquid crystal displays employing the FFS mode are driven by a fringing field generated between slit electrodes provided in an upper layer for control of liquid crystals and the pixel electrodes disposed via an interlayer insulation film in a layer below the slit electrodes. With this configuration, a decrease in the aperture ratio of pixels can be suppressed by forming the pixel electrodes and the slit electrodes of an oxide-based transparent conductive film such as indium tin oxide (ITO) containing indium oxide and tin oxide, or InZnO containing indium oxide and zinc oxide.

Moreover, unlike the liquid crystal displays employing the TN mode, the liquid crystal displays employing the FFS mode are not always required to form separate patterns of storage capacitors in pixels because the pixel electrodes and the slit electrodes form storage capacitors. Thus, the aperture ratio of the pixels can be kept high.

Conventionally, switching devices of thin-film transistors (i.e., TFTs) for liquid crystal displays have generally used amorphous silicon (a-Si) as a channel layer of a semiconductor. One chief reason for this is that amorphous properties allow a film to be formed with highly uniform characteristics even on a large-area substrate. Another chief reason for using amorphous silicon is its high compatibility with liquid crystal displays for general TVs because amorphous silicon can be deposited at relatively low temperatures and therefore can form a film even on low-cost glass substrates, which are inferior in heat resistance.

However, thin-film transistors using an oxide semiconductor as a channel layer have been developed actively in recent years. The use of an oxide semiconductor makes it possible to stably form a highly uniform amorphous film by optimizing the composition of the film. Such a film using an oxide semiconductor has higher carrier mobility than conventional films using amorphous silicon, and therefore, has an advantage of capable of manufacturing a compact, high-performance thin-film transistor. Accordingly, a liquid crystal display with a high pixel aperture ratio can be achieved by applying such an oxide semiconductor film to a thin-film transistor on an array substrate of liquid crystal pixels.

Additionally, low carrier mobility of amorphous silicon causes the need to install a separate driving circuit for applying a driving voltage to thin-film transistors of liquid crystal pixels. In contrast, if a thin-film transistor using an oxide semiconductor with high carrier mobility is used as a driving circuit, it is possible to prepare a driving circuit on an array substrate of liquid crystal pixels. This eliminates the need to install a separate driving circuit, thereby making it possible to prepare a liquid crystal display at low cost and to narrow a frame area of the liquid crystal display, the area being necessary to install a driving circuit.

In the case of amorphous silicon, the predominant structure is a back channel etching (i.e., BCE) structure in which a channel region of a semiconductor layer is subjected to wet etching during formation of source and drain electrodes. However, if an oxide semiconductor is applied to such a thin-film transistor having the back channel etching structure, a channel cannot be formed because the oxide semiconductor will also be etched during wet etching of the source and drain electrodes.

In order to overcome this problem, for example, Patent Document 1 discloses a structure in which a channel protective film of silicon (Si) is formed on a channel of an oxide semiconductor. With this structure, it is possible to form the channel of the oxide semiconductor because the oxide semiconductor is not subjected to wet etching during wet etching of the source and drain electrodes, which is conducted after formation of the channel protective film. It is thus possible to prepare a thin-film transistor using an oxide semiconductor as a channel layer.

Note that, for example, Non-Patent Document 1 implies that electrons are stored in a region of a channel protective film that overlaps with a drain electrode.

PRIOR ART DOCUMENTS

Patent Document

Patent Document 1: Japanese Patent Application Laid-Open No. 2010-212672

Non-Patent Document

Non-Patent Document 1: Tien-Yu Hsieh, et. al., "Characterization and Investigation of a Hot-Carrier Effect in Via- Contact Type a-InGaZnO Thin-Film Transistors," IEEE TRANSACTIONS ON ELECTRON DEVICES VOL. 60 NO. 5, 2013, p 1681

SUMMARY

Problem to be Solved by the Invention

If the channel protective film is formed as disclosed in Patent Document 1, the channel can be formed properly without the oxide semiconductor being subjected to wet etching during wet etching of the source and drain electrodes.

However, thin-film transistors using an oxide semiconductor are known to store holes under the application of light negative bias temperature stress (i.e., LNBTS), which causes a shift in the negative direction of the threshold voltage. Thus, if thin-film transistors using an oxide semiconductor are installed in an LCD, the threshold voltage will be shifted in the negative direction by the application of light from a backlight.

Besides, as described above, for example Non-Patent Document 1 implies that electrons are stored in the region of the channel protective film that overlaps with the drain electrode. The storage of electrons in the channel protective film causes a shift in the positive direction of the threshold voltage of the thin-film transistor.

To improve the reliability of LCDs, it is essential to suppress such fluctuations in the threshold voltages of thin-film transistors.

The present technique is for solving the problems as described above, and relates to a transistor that uses an oxide semiconductor as a channel layer and that is capable of suppressing fluctuations in threshold voltage, and to a thin-film transistor substrate and a liquid crystal display that include such a transistor.

Means to Solve the Problem

A transistor according an aspect of the present technique includes a gate electrode, a gate insulating film that covers at least the gate electrode, an oxide semiconductor layer formed in a position on the gate insulating film, the position including a position that overlaps with the gate electrode in plan view, a channel protective film that covers part of the oxide semiconductor layer, a source electrode that covers part of the channel protective film and part of the oxide semiconductor layer, and a drain electrode that is spaced from the source electrode and covers part of the channel protective film and part of the oxide semiconductor layer. A length of overlap in plan view between the source electrode and the channel protective film in a direction from the source electrode toward the drain electrode is longer than a length of overlap in plan view between the drain electrode and the channel protective film in a direction from the drain electrode toward the source electrode.

A thin-film transistor substrate according to an aspect of the present technique is a thin-film transistor substrate including the transistor described above. The transistor is used in a circuit that drives a pixel transistor that is a transistor corresponding to a pixel in a liquid crystal display, the circuit that drives the pixel transistor includes a first transistor, a second transistor, a third transistor, and a capacitor, the first transistor has a source electrode connected to one electrode of the capacitor and to a drain electrode of the second transistor, the capacitor has the other electrode connected to a gate electrode of the first transistor and to a source electrode of the third transistor, at least the third transistor is the transistor described above, and the transistor is formed on a substrate that is the same as the thin-film transistor substrate that is an array substrate on which the pixel transistor is formed.

A thin-film transistor substrate according to another aspect of the present technique is a thin-film transistor substrate including the transistor described above. The transistor is used in an inverter circuit that drives a pixel transistor that is a transistor corresponding to a pixel in a liquid crystal display, the inverter circuit that drives the pixel transistor includes a first transistor and a second transistor, the first transistor has a source electrode connected to a gate electrode of the first transistor and to a drain electrode of the second transistor, the second transistor has a source electrode connected to a power supply potential, at least the first transistor is the transistor described above, and the transistor is formed on a substrate that is the same as the thin-film transistor substrate that is an array substrate on which the pixel transistor is formed.

A thin-film transistor substrate according to another aspect of the present technique is a thin-film transistor substrate including the transistor described above. The transistor further includes an additional protective film formed to cover the source electrode, the drain electrode, the channel protective film, and the gate insulating film, and a top gate electrode formed in a position on an upper surface of the additional protective film, the position overlapping with the oxide semiconductor layer in plan view, the transistor is used in a circuit that drives a pixel transistor that is a transistor corresponding to a pixel in a liquid crystal display, the circuit that drives the pixel transistor includes a first transistor, a second transistor, a third transistor, and a capacitor, the first transistor has a source electrode connected to one electrode of the capacitor and to a drain electrode of the second transistor, the capacitor has the other electrode connected to a gate electrode of the first transistor and to a source electrode of the third transistor, at least the first transistor is the transistor described above, the top gate electrode of the first transistor is connected to the gate electrode of the first transistor, and the transistor is formed on a substrate that is the same as the thin-film transistor substrate that is an array substrate on which the pixel transistor is formed.

A thin-film transistor substrate according to another aspect of the present technique is a thin-film transistor substrate including the transistor described above. The transistor is used as a pixel transistor that is a transistor corresponding to a pixel in a liquid crystal display, and the thin-film transistor substrate is an array substrate on which the pixel transistor is formed.

A thin-film transistor substrate according to another aspect of the present technique is a thin-film transistor substrate including a plurality of transistors each being the transistor described above. The plurality of transistors include a transistor that is used to drive a pixel transistor that is a transistor corresponding to a pixel in a liquid crystal display, and a transistor that is used as the pixel transistor, the thin-film transistor substrate is an array substrate on which the pixel transistor is formed, and the transistor that is used to drive the pixel transistor is formed on a substrate that is the same as the thin-film transistor substrate.

A liquid crystal display according to an aspect of the present technique includes the thin-film transistor substrate described above, an opposite substrate disposed opposite the thin-film transistor substrate, a liquid crystal layer that is sandwiched between the thin-film transistor substrate and the opposite substrate, and a backlight disposed on a side of the thin-film transistor substrate opposite the opposite substrate.

Effects of the Invention

A transistor according to an aspect of the present technique includes a gate electrode, a gate insulating film that covers at least the gate electrode, an oxide semiconductor layer formed in a position on the gate insulating film, the position including a position that overlaps with the gate electrode in plan view, a channel protective film that covers part of the oxide semiconductor layer, a source electrode that covers part of the channel protective film and part of the oxide semiconductor layer, and a drain electrode that is spaced from the source electrode and covers part of the channel protective film and part of the oxide semiconductor layer. A length of overlap in plan view between the source electrode and the channel protective film in a direction from the source electrode toward the drain electrode is longer than a length of overlap in plan view between the drain electrode and the channel protective film in a direction from the drain electrode toward the source electrode.

With this configuration, a shift in the negative direction of the threshold voltage under the application of light negative bias temperature stress can be suppressed without increasing the size of the transistor, because the length of overlap in plan view between the source electrode and the channel protective film is longer than the length of overlap in plan view between the drain electrode and the channel protective film. Besides, a shift in the positive direction of the threshold voltage can be suppressed because the storage of electrons in the channel protective film is suppressed.

A thin-film transistor substrate according to an aspect of the present technique is a thin-film transistor substrate including the transistor described above. The transistor is used in a circuit that drives a pixel transistor that is a transistor corresponding to a pixel in a liquid crystal display, the circuit that drives the pixel transistor includes a first transistor, a second transistor, a third transistor, and a capacitor, the first transistor has a source electrode connected to one electrode of the capacitor and to a drain electrode of the second transistor, the capacitor has the other electrode connected to a gate electrode of the first transistor and to a source electrode of the third transistor, at least the third transistor is the transistor described above, and the transistor is formed on a substrate that is the same as the thin-film transistor substrate that is an array substrate on which the pixel transistor is formed.

With this configuration in which the oxide semiconductor layer is used as a channel layer, the transistor can be made more compact thanks to high carrier mobility. Thus, if a driving circuit is prepared using such a transistor that uses an oxide semiconductor as a channel layer, the driving circuit can be made more compact and can be housed within the frame area of the array substrate. Accordingly, it is possible to reduce the cost of the driving circuit and to narrow the frame area.

A thin-film transistor substrate according to another aspect of the present technique is a thin-film transistor substrate including the transistor described above. The transistor is used in an inverter circuit that drives a pixel transistor that is a transistor corresponding to a pixel in a liquid crystal display, the inverter circuit that drives the pixel transistor includes a first transistor and a second transistor, the first transistor has a source electrode connected to a gate electrode of the first transistor and to a drain electrode of the second transistor, the second transistor has a source electrode connected to a power supply potential, at least the first transistor is the transistor described above, and the transistor is formed on a substrate that is the same as the thin-film transistor substrate that is an array substrate on which the pixel transistor is formed.

With this configuration in which the oxide semiconductor layer is used as a channel layer, the transistor can be made more compact thanks to high carrier mobility. Thus, if a driving circuit is prepared using such a transistor that uses an oxide semiconductor as a channel layer, the driving circuit can be made more compact and can be housed within the frame area of the array substrate. Accordingly, it is possible to reduce the cost of the driving circuit and to narrow the frame area.

A thin-film transistor substrate according to another aspect of the present technique is a thin-film transistor substrate including the transistor described above. The transistor further includes an additional protective film formed to cover the source electrode, the drain electrode, the channel protective film, and the gate insulating film, and a top gate electrode formed in a position on an upper surface of the additional protective film, the position overlapping with the oxide semiconductor layer in plan view, the transistor is used in a circuit that drives a pixel transistor that is a transistor corresponding to a pixel in a liquid crystal display, the circuit that drives the pixel transistor includes a first transistor, a second transistor, a third transistor, and a capacitor, the first transistor has a source electrode connected to one electrode of the capacitor and to a drain electrode of the second transistor, the capacitor has the other electrode connected to a gate electrode of the first transistor and to a source electrode of the third transistor, at least the first transistor is the transistor described above, the top gate electrode of the first transistor is connected to the gate electrode of the first transistor, and the transistor is formed on a substrate that is the same as the thin-film transistor substrate that is an array substrate on which the pixel transistor is formed.

With this configuration in which the oxide semiconductor layer is used as a channel layer, the transistor can be made more compact thanks to high carrier mobility. Thus, if a driving circuit is prepared using such a transistor that uses an oxide semiconductor as a channel layer, the driving circuit can be made more compact and can be housed within the frame area of the array substrate. Accordingly, it is possible to reduce the cost of the driving circuit and to narrow the frame area.

A thin-film transistor substrate according to another aspect of the present technique is a thin-film transistor substrate including the transistor described above. The transistor is used as a pixel transistor that is a transistor corresponding to a pixel in a liquid crystal display, and the thin-film transistor substrate is an array substrate on which the pixel transistor is formed.

This configuration can reduce the area of overlap between the gate electrode and the drain electrode. It is thus possible to reduce parasitic capacitance, which may be a cause of pixel burn-in or unevenness in display.

A thin-film transistor substrate according to another aspect of the present technique is a thin-film transistor substrate including a plurality of transistors each being the transistor described above. The plurality of transistors include a transistor that is used to drive a pixel transistor that is a transistor corresponding to a pixel in a liquid crystal display, and a transistor that is used as the pixel transistor, the thin-film transistor substrate is an array substrate on which which the pixel transistor is formed, and the transistor that is used to drive the pixel transistor is formed on a substrate that is the same as the thin-film transistor substrate.

With this configuration in which the oxide semiconductor layer is used as a channel layer, the transistor can be made more compact thanks to high carrier mobility. Thus, if a driving circuit is prepared using such a transistor that uses an oxide semiconductor as a channel layer, the driving circuit can be made more compact and can be housed within the frame area of the array substrate. Accordingly, it is possible to reduce the cost of the driving circuit and to narrow the frame area.

Besides, the area of overlap between the gate electrode and the drain electrode can be reduced. It is thus possible to reduce parasitic capacitance, which may be a cause of pixel burn-in or unevenness in display.

A liquid crystal display according to an aspect of the present technique includes the thin-film transistor substrate described above, an opposite substrate disposed opposite the thin-film transistor substrate, a liquid crystal layer that is sandwiched between the thin-film transistor substrate and the opposite substrate, and a backlight disposed on a side of the thin-film transistor substrate opposite the opposite substrate.

This configuration can suppress the storage of holes, which is caused by the application of light from the backlight.

These and other objects, features, aspects and advantages of the present invention will become more apparent from the following detailed description of the present invention when taken in conjunction with the accompanying drawings.

BRIEF DESCRIPTION OF DRAWINGS

FIG. 29 schematically illustrates a configuration of a driving voltage generating circuit according to an embodiment.

FIG. 30 illustrates waveforms of voltages applied to each node in FIG. 29.

DESCRIPTION OF EMBODIMENTS

Figure 1:
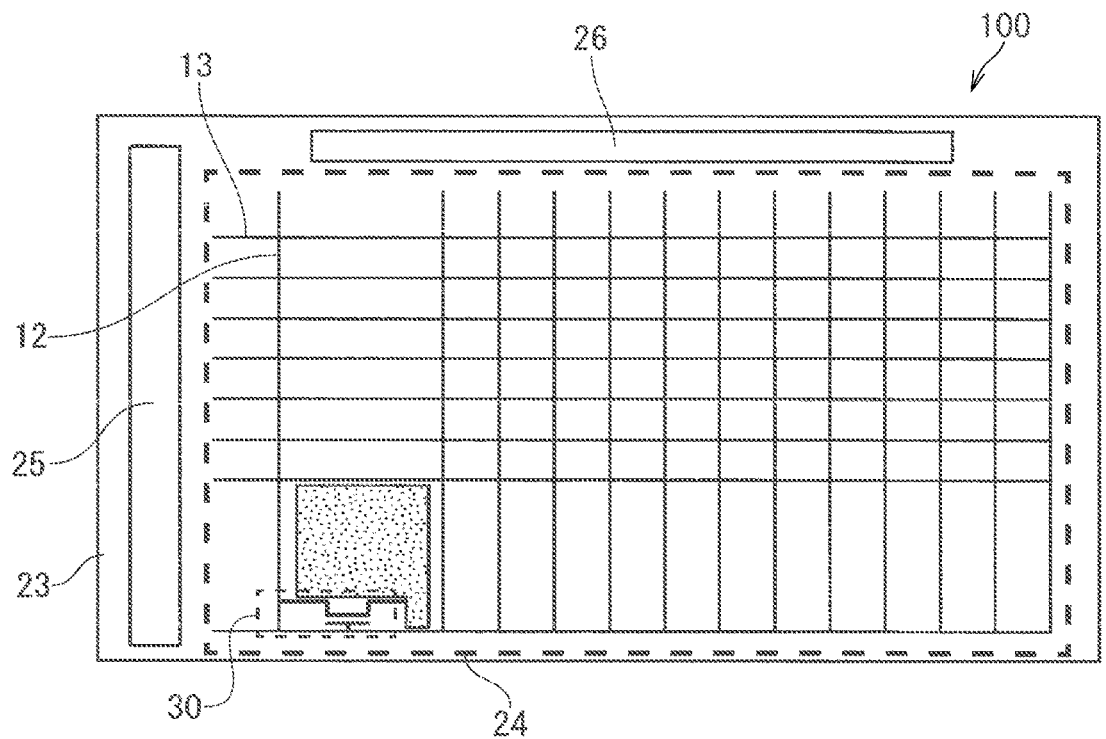
FIG. 1 is a plan view schematically illustrating an overall configuration of a liquid crystal display according to an embodiment.

Embodiments will now be described hereinafter with reference to the accompanying drawings. The drawings are drawn in schematic form, and mutual relationships between sizes and positions of images illustrated in different drawings do not always reflect actual relationships and may be appropriately changed. In the following description, the same reference numerals denote similar constituent elements that have similar names and similar functions. Thus, detailed description of such similar constituent elements may be omitted in some cases.

Terms such as "upper," "lower," "side," "bottom," "front," and "rear" that may be used in the following description to indicate specific positions and directions are merely used for convenience's sake in order to facilitate understanding of the content of embodiments, and do not relate to directions at the time of actual implementation.

In the following embodiments, an array substrate is described as an active matrix substrate using thin-film transistors (TFTs) as switching devices. Assume that the array substrate is used in a flat panel display such as a liquid crystal display (LCD).

First Embodiment

<Configuration>
A transistor, a thin-film transistor substrate, and a liquid crystal display according to an embodiment of the present invention will now be described hereinafter.

FIG. 1 is a plan view schematically illustrating an overall configuration of a liquid crystal display according to the present embodiment. The liquid crystal display includes a display area 24 and a frame area 23 on an array substrate 100 as illustrated in FIG. 1, the display area 24 having pixels arranged in a matrix, the pixels including pixel transistors 30 that are thin-film transistors for pixels, and the frame area 23 being disposed surrounding the display area 24.

In the display area 24, a plurality of gate lines (scanning signal lines) 13 and a plurality of source lines (display signal lines) 12 are arranged orthogonal to each other.

In the frame area 23, a scanning signal driving circuit 25 that applies a driving voltage to the gate lines 13 and a display signal driving circuit 26 that applies a driving voltage to the source lines 12 are arranged.

When current is passed through one of the gate lines 13 by application of a driving voltage from the scanning signal driving circuit 25 and is passed through one of the source lines 12 by application of a driving voltage from the display signal driving circuit 26, the pixel transistor 30 at the intersection of these lines is turned on, and electric charge is stored in a pixel electrode that is connected to the pixel transistor 30.

The pixel transistors 30 that use an oxide semiconductor as their channel layers can be made compact because oxide semiconductors have high carrier mobility. Thus, if, like the pixel transistors 30, the scanning signal driving circuit 25 and the display signal driving circuit 26 disposed on the same substrate as the pixel transistors 30 are prepared using drive transistors 20 that are thin-film transistors for drive using an oxide semiconductor as their channel layers, the scanning signal driving circuit 25 and the display signal driving circuit 26 can be made more compact and can be housed within the frame area 23 of the array substrate 100. Accordingly, it is possible to reduce the cost of the driving circuits and to narrow the frame area 23.

The scanning signal driving circuit 25 includes a plurality of driving voltage generating circuits 250, each including a drive transistor 20a, a drive transistor 20b, and a drive transistor 20c as illustrated in FIG. 29. This configuration is the same as the display signal driving circuit 26. It is assumed here that the current flowing through the drive transistor 20a, the drive transistor 20b, and the drive transistor 20c flows from drain electrodes to source electrodes.

Each driving voltage generating circuit 250 includes the drive transistor 20a having a drain that receives application of a clock signal CLK, the drive transistor 20b having a source that receives application of a power supply potential VSS and having a drain connected to a source of the drive transistor 20a, and the drive transistor 20c having a drain that receives application of a power supply potential VDD and having a source connected to a gate of the drive transistor 20a. The driving voltage generating circuit 250 further includes a capacitor C1. The capacitor C1 has one electrode connected to the source of the drive transistor 20a. The other electrode of the capacitor C1 is connected to a gate electrode of the drive transistor 20a and a source electrode of the drive transistor 20c.

The configuration is such that a source of the drive transistor 20c is connected via the capacitor C1 to a node of connection between the drive transistor 20a and the drive transistor 20b, and the node of connection between the drive transistor 20a and the drive transistor 20b serves as an output node N1 to apply a driving voltage to a gate line 13 and a source line 12.

When the drive transistor 20c is turned on by application of a signal to the gate of the drive transistor 20c, the drive transistor 20a is turned on and outputs the clock signal CLK from the output node N1, and when the drive transistor 20b is turned on by application of a signal to the gate of the drive transistor 20b, a potential at the output node N1 drops to the power supply potential VSS.

Figure 2:
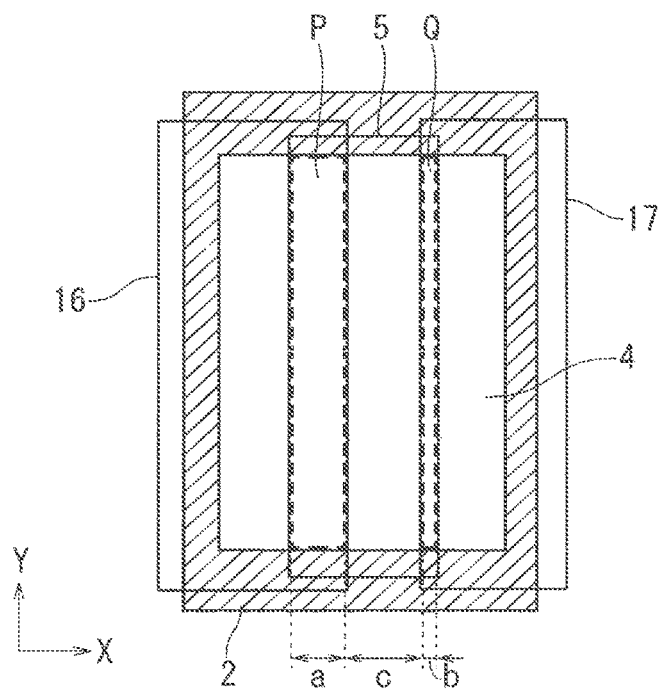
FIG. 2 illustrates a planar structure of a thin-film transistor for drive.
Figure 3:
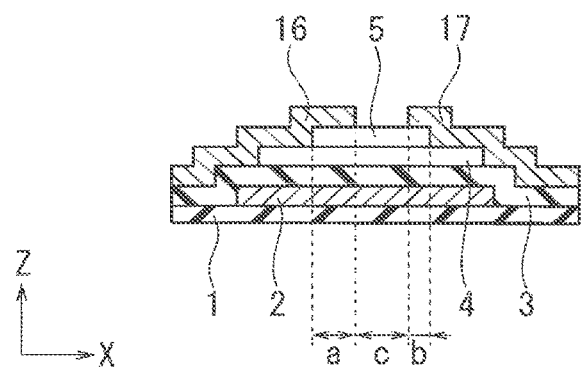
FIG. 3 illustrates a cross-sectional structure of the thin-film transistor for drive.

The structures of the drive transistor 20a, the drive transistor 20b, and the drive transistor 20c for drive in the driving voltage generating circuit 250 with this configuration will now be described with reference to FIGS. 2 and 3. FIG. 2 illustrates a planar structure of a thin-film transistor for drive. FIG. 3 illustrates a cross-sectional structure of the thin-film transistor for drive.

The thin-film transistor includes a transparent insulating substrate 1 such as glass and a gate electrode 2 formed on part of the insulating substrate 1 as illustrated in FIGS. 2 and 3. Note that the gate lines 13 illustrated in FIG. 1 are also formed on the insulating substrate 1, and the gate electrode 2 is electrically connected to the gate lines 13.

The thin-film transistor further includes a gate insulating film 3 formed to cover the insulating substrate 1 and the gate electrode 2. The thin-film transistor also includes a semiconductor layer 4 formed on part of the gate insulating film 3. The semiconductor layer 4 overlaps with the gate electrode 2 in plan view. Note that the semiconductor layer 4 is desirably formed on the inner side of the gate electrode 2 in plan view.

The thin-film transistor further includes a channel protective film 5 formed on part of the semiconductor layer 4. The channel protective film 5 is formed on a region that serves as a channel region during operations of the thin-film transistor.

The thin-film transistor also includes a source electrode 16 and a drain electrode 17 that are formed to cover part of the channel protective film 5, the semiconductor layer 4, and the gate insulating film 3. The source electrode 16 and the drain electrode 17 are spaced from each other.

It is assumed here that an overlap length a in the x direction between the source electrode 16 and the channel protective film 5 is longer than an overlap length b in the x direction between the drain electrode 17 and the channel protective film 5 as illustrated in FIG. 3. Here, the area of junction between the semiconductor layer 4 and the source electrode 16 may be the same as the area of junction between the semiconductor layer 4 and the drain electrode 17. In this case, it is conceivable that a difference between the overlap length a and the overlap length b may unintentionally vary depending on the precision in the manufacturing process. In view of this, the difference between the overlap length a and the overlap length b is set to two times or more of mask overlay accuracy in the lithographic process.

The thin-film transistor may be in any mode among a depletion mode in which the threshold voltage is negative, a normal mode in which the threshold voltage is 0V, and an enhancement mode in which the threshold voltage is positive. In the case of using, for example, a thin-film transistor in the depletion mode, large ON-state current can be obtained at low gate voltages.

The thin-film transistor further includes a protective film formed to cover the channel protective film 5, the source electrode 16, and the drain electrode 17. The protective film is not shown in the figures.

Figure 4:
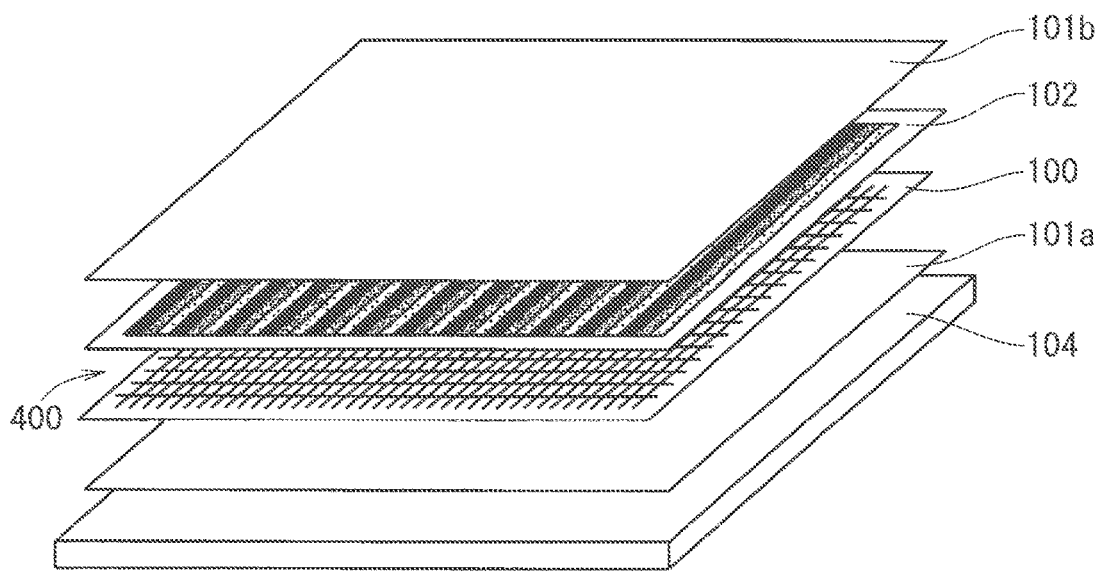
FIG. 4 illustrates a configuration of a liquid crystal display that includes the thin-film transistor according to the embodiment.

FIG. 4 illustrates a configuration of a liquid crystal display that includes the thin-film transistor according to the present embodiment. As illustrated in FIG. 4, the liquid crystal display includes a backlight 104, a polarizing plate 101a disposed on the backlight 104, an array substrate 100 disposed on the polarizing plate 101a, a color filter 102 disposed on the array substrate 100, and a polarizing plate 101b disposed on the color filter 102. It is assumed here that the polarization direction of the polarizing plate 101a and the polarization direction of the polarizing plate 101b are orthogonal to each other.

<Manufacturing Method>

A process of manufacturing the thin-film transistor of the liquid crystal display according to the present embodiment will now be described hereinafter with reference to FIGS. 8 to 20. FIGS. 8 to 20 are cross-sectional views illustrating a structure of the liquid crystal display in each manufacturing step in the process of manufacturing the thin-film transistor of the liquid crystal display according to the present embodiment. The structure illustrated in FIG. 3 corresponds to a cross-sectional view in the final step.

Figure 8:
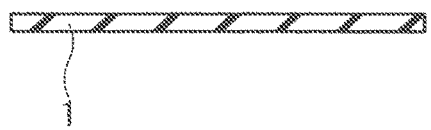
FIG. 8 is a cross-sectional view illustrating a structure of the liquid crystal display at each manufacturing step in the process of manufacturing the thin-film transistor of the liquid crystal display according to the embodiment (preparation of an insulating substrate).
Figure 9:
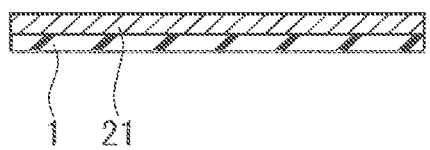
FIG. 9 is a cross-sectional view illustrating a structure of the liquid crystal display at each manufacturing step in the process of manufacturing the thin-film transistor of the liquid crystal display according to the embodiment (formation of a metal film).

First, the transparent insulating substrate 1 such as glass is prepared as illustrated in FIG. 8. Then, a metal film 21 is formed of, for example, an aluminum-based (Al-based) alloy film, and more specifically, an alloy film of aluminum with additions of 3 mol % nickel (Ni) (Al-3 mol % Ni film), on the entire surface of the transparent insulating substrate 1 as illustrated in FIG. 9. The Al-3 mol % Ni film may be deposited by sputtering using an Al-3 mol % Ni alloy target. Here, the metal film 21 is formed by depositing an Al-3 mol % Ni film having a thickness of 100 nm. Note that gas such as argon (Ar) gas or krypton (Kr) gas may be used as a sputtering gas.

Figure 10:
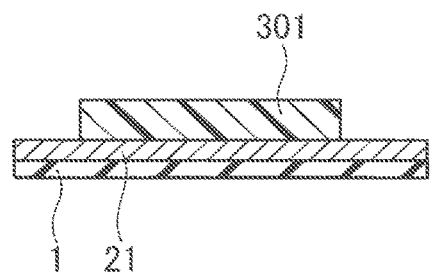
FIG. 10 is a cross-sectional view illustrating a structure of the liquid crystal display at each manufacturing step in the process of manufacturing the thin-film transistor of the liquid crystal display according to the embodiment (formation of a resist pattern).

Next, a photoresist is applied to the metal film 21 and patterned in a photolithographic process to form a resist pattern 301 as illustrated in FIG. 10. The photoresist may be formed by applying a photoresist material made of, for example, a novolac-based, positive-type photosensitive resin to a thickness of approximately 1.5 μm on the metal film 21 by coating.

Figure 11:
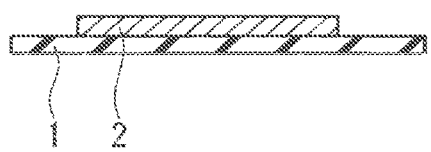
FIG. 11 is a cross-sectional view illustrating a structure of the liquid crystal display at each manufacturing step in the process of manufacturing the thin-film transistor of the liquid crystal display according to the embodiment (patterning of the metal film).

Next, using the resist pattern 301 as an etching mask, the metal film 21 is patterned by wet etching using a PAN-based solution containing a phosphoric acid, an acetic acid, and a nitric acid, as illustrated in FIG. 11. As a result, the gate electrode 2 is formed on the transparent insulating substrate 1.

Figure 12:
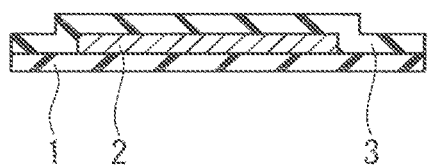
FIG. 12 is a cross-sectional view illustrating a structure of the liquid crystal display at each manufacturing step in the process of manufacturing the thin-film transistor of the liquid crystal display according to the embodiment (formation of a silicon oxide film).

After the resist pattern 301 is stripped off and removed using an amine-based resist stripper, a silicon oxide (SiO) film that covers the transparent insulating substrate 1 and the gate electrode 2 is formed as illustrated in FIG. 12. The silicon oxide film functions as the gate insulating film 3 on the gate electrode 2 of the thin-film transistor. The silicon oxide film may be formed to a thickness ranging from, for example, approximately 50 nm to approximately 500 nm by plasma chemical vapor deposition (i.e., CVD) using silane ($SiH_4$) gas and nitrous oxide ($N_2O$) gas.

Figure 13:
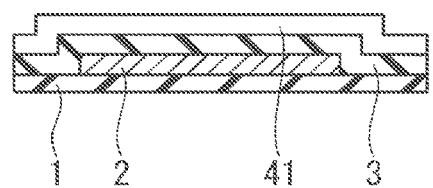
FIG. 13 is a cross-sectional view illustrating a structure of the liquid crystal display at each manufacturing step in the process of manufacturing the thin-film transistor of the liquid crystal display according to the embodiment (formation of a semiconductor layer).

Next, a semiconductor layer 41 that covers the entire surface of the gate insulating film 3 is formed as illustrated in FIG. 13. In the present embodiment, the semiconductor layer 41 is made of an InGaZnO-based oxide semiconductor of indium oxide ($In_2O_3$) with additions of gallium oxide ($Ga_2O_3$) and zinc oxide (ZnO).

Here, for example, the semiconductor layer 41 may be formed by DC sputtering using an InGaZnO target ($In_2O_3 \cdot (Ga_2O_3) \cdot (ZnO)_2$) in which the atomic composition ratio of In, Ga, Zn, and O is 1:1:1:4. At this time, a commonly known gas such as argon (Ar) gas or krypton (Kr) gas may be used as a sputtering gas.

Such an InGaZnO film formed by sputtering generally has a lower atomic composition ratio of oxygen than a stoichiometric composition ratio and will be an oxide film with a deficiency of oxygen ions (in the above example, the composition ratio of oxygen is less than 4). It is thus desirable to mix oxygen ($O_2$) gas with Ar gas for use in sputtering. Here, sputtering may be conducted using a mixed gas obtained by adding O₂ gas to Ar gas at a voltage dividing ratio of 10%, and for example, an InGaZnO-based oxide semiconductor layer may be formed to a thickness of 40 nm. Note that the InGaZnO film may have an amorphous structure.

Figure 14:
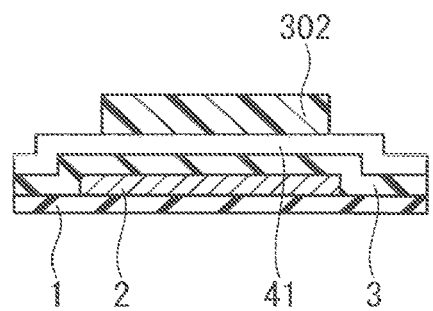
FIG. 14 is a cross-sectional view illustrating a structure of the liquid crystal display at each manufacturing step in the process of manufacturing the thin-film transistor of the liquid crystal display according to the embodiment (formation of a resist pattern).

Next, a photoresist is formed on the semiconductor layer 41 and patterned in a photolithographic process to form a resist pattern 302 as illustrated in FIG. 14. The photoresist may be formed by applying a photoresist material made of, for example, a novolac-based, positive-type photosensitive resin to the semiconductor layer 41 by coating. The photoresist may have a thickness of approximately 1.5 µm.

Figure 15:
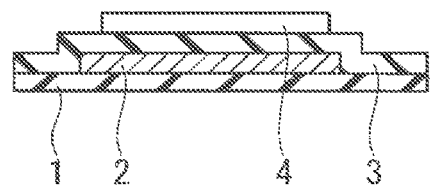
FIG. 15 is a cross-sectional view illustrating a structure of the liquid crystal display at each manufacturing step in the process of manufacturing the thin-film transistor of the liquid crystal display according to the embodiment (patterning of the semiconductor layer)

Next, using the resist pattern 302 as an etching mask, the semiconductor layer 41 is patterned by wet etching using a solution containing a nitric acid as illustrated in FIG. 15. As a result, the semiconductor layer 4 is formed overlapping with the gate electrode 2 in plan view. Here, the semiconductor layer 4 may have a portion that lies off the area of overlap with the gate electrode 2 in plan view. Thereafter, the resist pattern 302 is stripped off and removed using an amine-based resist stripper.

Figure 16:
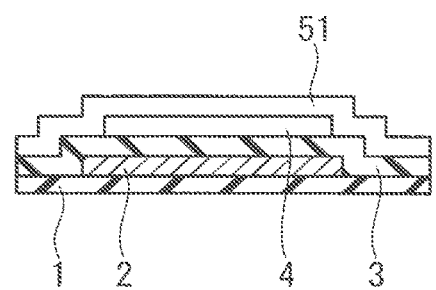
FIG. 16 is a cross-sectional view illustrating a structure of the liquid crystal display at each manufacturing step in the process of manufacturing the thin-film transistor of the liquid crystal display according to the embodiment (formation of a silicon oxide film).

Next, a silicon oxide film 51 that covers the gate insulating film 3 and the semiconductor layer 4 is formed as illustrated in FIG. 16. A portion of the silicon oxide film 51, located above the semiconductor layer 4 of the thin-film transistor, functions as a channel protective film.

The silicon oxide film 51 may be formed to a thickness ranging from, for example, approximately 50 nm to approximately 300 nm by plasma CVD using silane ($SiH_4$) gas and nitrous oxide ($N_2O$) gas.

Figure 17:
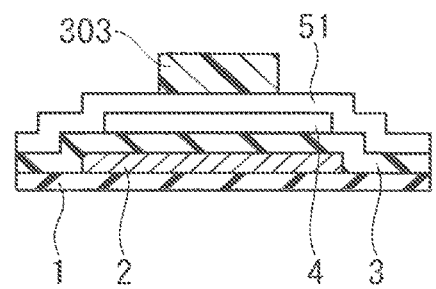
FIG. 17 is a cross-sectional view illustrating a structure of the liquid crystal display at each manufacturing step in the process of manufacturing the thin-film transistor of the liquid crystal display according to the embodiment (formation of a resist pattern).

Next, a photoresist is formed on the silicon oxide film 51 and patterned in a photolithographic process to form a resist pattern 303 as illustrated in FIG. 17. The photoresist may be formed by applying a photoresist material made of, for example, a novolac-based, positive-type photosensitive resin to the silicon oxide film 51 by coating. The photoresist may have a thickness of approximately 1.5 µm.

Figure 18:
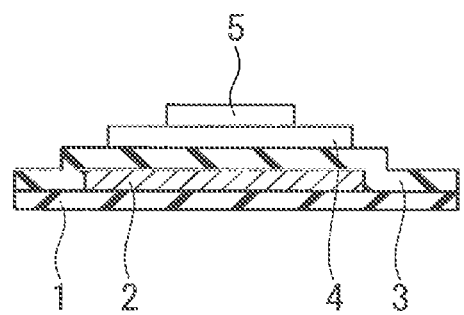
FIG. 18 is a cross-sectional view illustrating a structure of the liquid crystal display at each manufacturing step in the process of manufacturing the thin-film transistor of the liquid crystal display according to the embodiment (formation of a channel protective film).

Next, using the resist pattern 303 as an etching mask, the silicon oxide film 51 is etched by dry etching using gas that contains fluorine such as $CHF_3$, $CF_4$, or $SF_6$ and oxygen ($O_2$) gas as illustrated in FIG. 18. As a result, the channel protective film 5 is formed. Then, the resist pattern 303 is stripped off and removed using an amine-based resist stripper.

Figure 19:
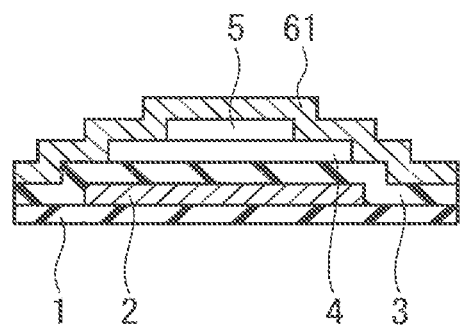
FIG. 19 is a cross-sectional view illustrating a structure of the liquid crystal display at each manufacturing step in the process of manufacturing the thin-film transistor of the liquid crystal display according to the embodiment (deposition of a metal film).

Next, a metal film 61 that covers the gate insulating film 3, the semiconductor layer 4, and the channel protective film 5 is deposited as illustrated in FIG. 19. The metal film 61 may have a two-layer structure of an Mo film and an Al-3 mol % Ni film, the Mo film being formed by DC sputtering using an Mo target, and the Al-3 mol % Ni film being formed by sputtering using an Al-3 mol % Ni alloy target. Assume that the Mo film and the Al-3 mol % Ni film have thicknesses in the range of, for example, approximately 10 nm to approximately 100 nm.

Figure 20:
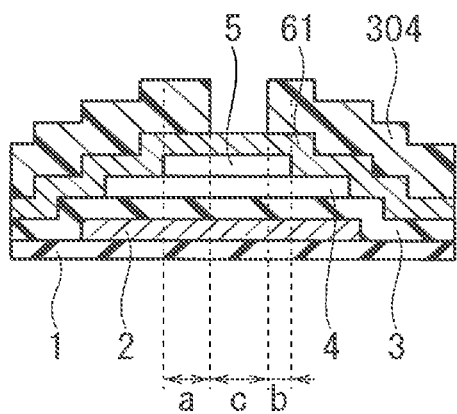
FIG. 20 is a cross-sectional view illustrating a structure of the liquid crystal display at each manufacturing step in the process of manufacturing the thin-film transistor of the liquid crystal display according to the embodiment (formation of a resist pattern).

Next, a photoresist is formed on the metal film 61 and patterned in a photolithographic process to form a resist pattern 304 as illustrated in FIG. 20. The photoresist may be formed by applying a photoresist material made of, for example, a novolac-based, positive-type photosensitive resin to the metal film 61 by coating. The photoresist may have a thickness of approximately 1.5 µm.

Then, using the resist pattern 304 as an etching mask, the metal film 61 is etched by wet etching using a PAN-based solution. As a result, the source electrode 16 and the drain electrode 17 are formed. In this way, the thin-film transistor illustrated in FIG. 3 is obtained. Here, the resist pattern 304 is formed such that the overlap length a between a portion of the metal film 61 that later serves as the source electrode 16 and the channel protective film 5 is longer than the overlap length b between a portion of the metal film 61 that later serves as the drain electrode 17 and the channel protective film 5.

Note that an orientation film and a spacer are formed on a surface of the array substrate 100 on which the finished thin-film transistor is installed. The orientation film is a film for arranging liquid crystals and made of a material such as polyimide.

Here, the color filter 102 illustrated in FIG. 4 is actually provided on an opposite substrate arranged opposite the array substrate 100. The array substrate 100 and the opposite substrate are bonded together with a constant space in between by the aforementioned spacer, and this space is sealed with injected liquid crystals. That is, a liquid crystal layer is sandwiched between the array substrate 100 and the opposite substrate. The polarizing plates 101a and 101b and the backlight 104 illustrated in FIG. 4 are further disposed on the outer surfaces of the array substrate 100 and the opposite substrate, which are bonded together as described above. This produces the liquid crystal display according to the present embodiment.

The liquid crystal display produced as described above features high resolution, high frame rate, long lifetime, and high reliability.

Advantageous Effects

According to the embodiment described above, the transistor includes the gate electrode 2, the gate insulating film 3, the semiconductor layer 4 which is an oxide semiconductor layer, the channel protective film 5, the source electrode 16, and the drain electrode 17.

The gate insulating film 3 covers at least the gate electrode 2. The semiconductor layer 4 is formed in a position on the gate insulating film 3, the position including a position overlapping with the gate electrode 2 in plan view.

The channel protective film 5 covers part of the semiconductor layer 4. The source electrode 16 covers the semiconductor layer 4 and part of the channel protective film 5. The drain electrode 17 is spaced from the source electrode 16 and covers the semiconductor layer 4 and part of the channel protective film 5.

Moreover, the overlap length a is longer than the overlap length b, the overlap length a being a length of overlap in plan view between the source electrode 16 and the channel protective film 5 in a direction from the source electrode 16 toward the drain electrode 17, and the overlap length b being a length of overlap in plan view between the drain electrode 17 and the channel protective film 5 in the direction from the source electrode 16 toward the drain electrode 17.

With this configuration, it is possible to suppress a shift in the negative direction of the threshold voltage under the application of light negative bias temperature stress, without increasing the size of the transistor, because the overlap length a (the length of overlap in plan view between the source electrode 16 and the channel protective film 5) is longer than the overlap length b (the length of overlap in a plane view between the drain electrode 17 and the channel protective film 5). Besides, a shift in the positive direction of the threshold voltage can be suppressed because the storage of electrons in the channel protective film 5 is suppressed.

While constituent elements other than those described above may be appropriately omitted, the advantageous effects described above can also be achieved even in the case where at least one of the other constituent elements described in the specification of the present invention is appropriately added.

Reasons for the advantageous effects described above will now be described hereinafter.

Figure 5:
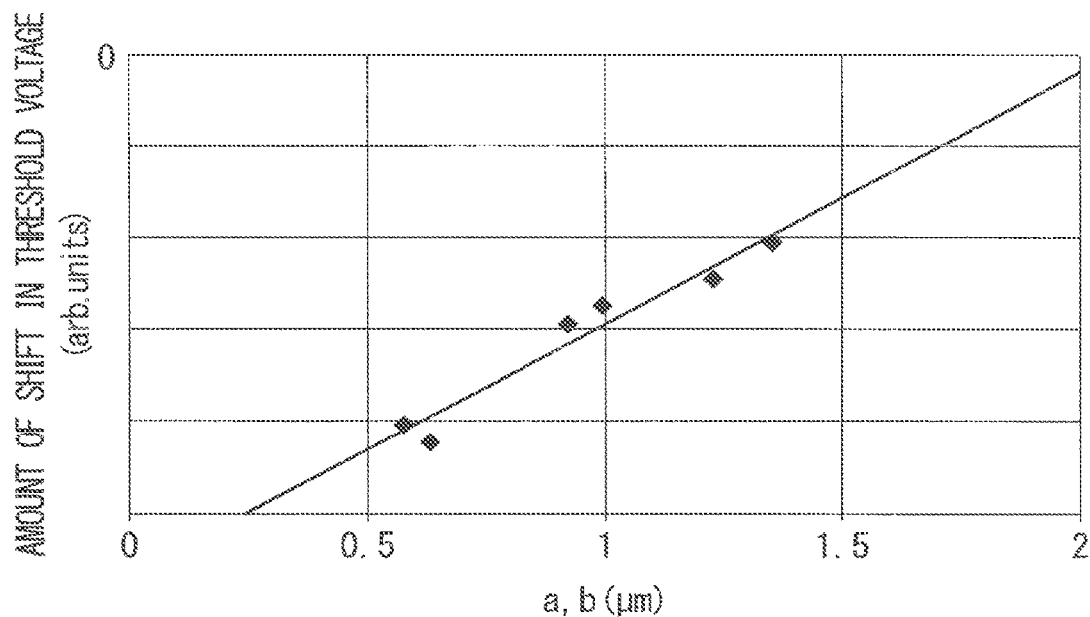
FIG. 5 illustrates the results of verifying a change in the amount of shift in the negative direction of the threshold voltage under the application of light negative bias temperature stress by using thin-film transistors each having a different overlap length a between a channel protective film and a source electrode and a different overlap length b between the channel protective film and a drain electrode.

FIG. 5 illustrates the results of verifying a change in the amount of shift in the negative direction of the threshold value under the application of light negative bias temperature stress by using thin-film transistors each having a different overlap length a between the channel protective film and the source electrode and a different overlap length b between the channel protective film and the drain electrode. The vertical axis in FIG. 5 indicates the amount of shift in the negative direction of the threshold voltage, and the horizontal axis indicates the length (μm) of the overlap length a and the length (in) of the overlap length b. Here, the length in the y direction of the channel in FIG. 3, i.e., channel width, is constant. The upper limit of the vertical axis is set to zero, and the vertical axis indicates a more negative shift of the voltage as it approaches its lower limit. In the case illustrated in FIG. 5, the overlap length a and the overlap length b always remain equal to each other.

Reference to FIG. 5 shows that the amount of shift in the negative direction of the threshold voltage decreases as the overlap length a and the overlap length b increase. Here, the distance between the source electrode and the drain electrode, i.e., distance c in FIGS. 2 and 3, remains unchanged. Thus, it is clear that the channel length of the thin-film transistor, i.e., the sum of the overlap length a, the overlap length b, and the distance c, varies with changes in the overlap length a between the channel protective film 5 and the source electrode 16 and the overlap length b between the channel protective film 5 and the drain electrode 17.

Figure 6:
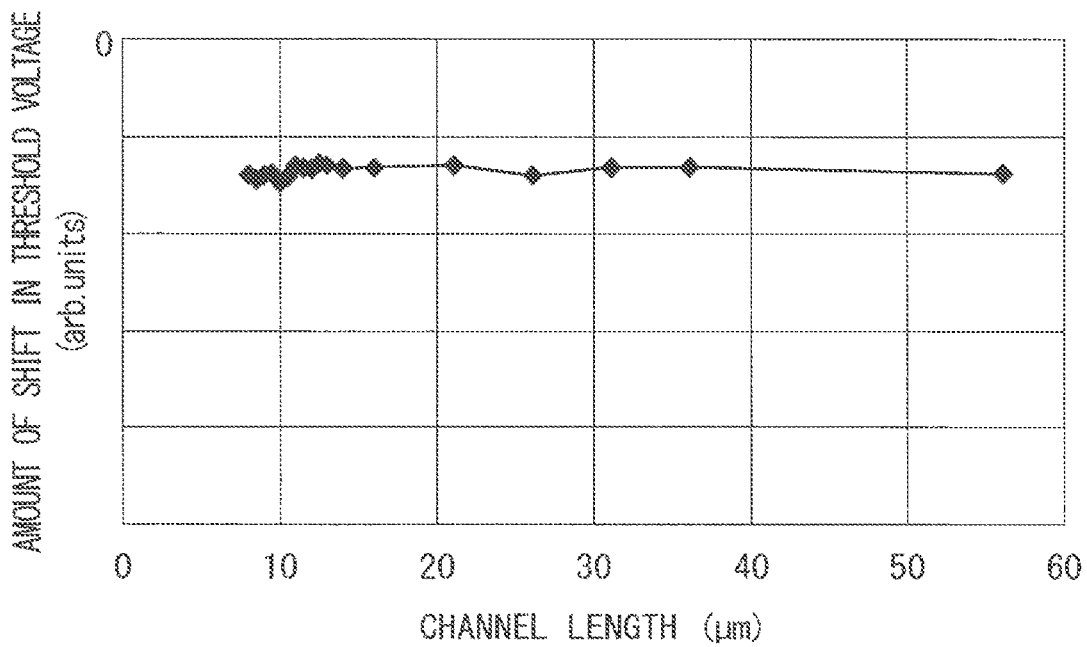
FIG. 6 illustrates the amount of shift in the negative direction of the threshold voltage under the application of light negative bias temperature stress, for different channel lengths while fixing the overlap length a between the channel protective film and the source electrode and the overlap length b between the channel protective film and the drain electrode.

FIG. 6 illustrates the amount of shift in the negative direction of the threshold voltage under the application of light negative bias temperature stress, for different channel lengths while fixing the overlap length a between the channel protective film 5 and the source electrode 16 and the overlap length b between the channel protective film 5 and the drain electrode 17. The vertical axis in FIG. 6 indicates the amount of shift in the negative direction of the threshold voltage, and the horizontal axis indicates the channel length (μm). The upper limit of the vertical axis is set to zero, and the vertical axis indicates a more negative shift of the voltage as it approaches its lower limit.

The vertical axis in FIG. 5 and the vertical axis in FIG. 6 indicate the same range of the amount of shift in the negative direction of the threshold voltage. Referring to FIG. 6, the amount of shift in the negative direction of the threshold voltage remains almost unchanged with a change in the channel length. On the other hand, reference to FIG. 5 shows that the amount of shift in the negative direction of the threshold voltage decreases as the overlap length a and the overlap length b increase.

These verification results clearly show that the amount of shift in the negative direction of the threshold voltage under the application of light negative bias temperature stress highly depends not on the channel length but on the overlap length a between the channel protective film 5 and the source electrode 16 and the overlap length b between the channel protective film 5 and the drain electrode 17.

According to, for example, a document (K.-H. Lee, et. al., Appl. Phys. Lett., vol. 95, No. 23, p. 232106, 2009), one conceivable cause of the shift in the negative direction of the threshold value under the application of light negative bias temperature stress is that optically excited holes in the semiconductor layer 4 are trapped at the interface between the semiconductor layer 4 and the gate insulating film 3 or in the gate insulating film 3.

By increasing the overlap length a and the overlap length b, regions P and Q enclosed by dotted lines in FIG. 2 are shielded from light, and electric fields in these regions are relieved. This is thought to suppress generation of carriers due to the application of light and suppress the storage of holes in the regions P and Q enclosed by the dotted lines in FIG. 2. That is, the verification result illustrated in FIG. 5 can be interpreted as showing that the storage of holes in the vicinity of the source electrode 16 and in the vicinity of the drain electrode 17 can be suppressed by increasing the overlap length a and the overlap length b.

Here, if the semiconductor layer 4 is formed on the inner side of the gate electrode 2 in plan view, it is possible to suppress the application of light to the underside (gate electrode side) of the semiconductor layer 4. This further suppresses the storage of holes in the vicinity of the source electrode 16 and the drain electrode 17 within the semiconductor layer 4.

Figure 7:
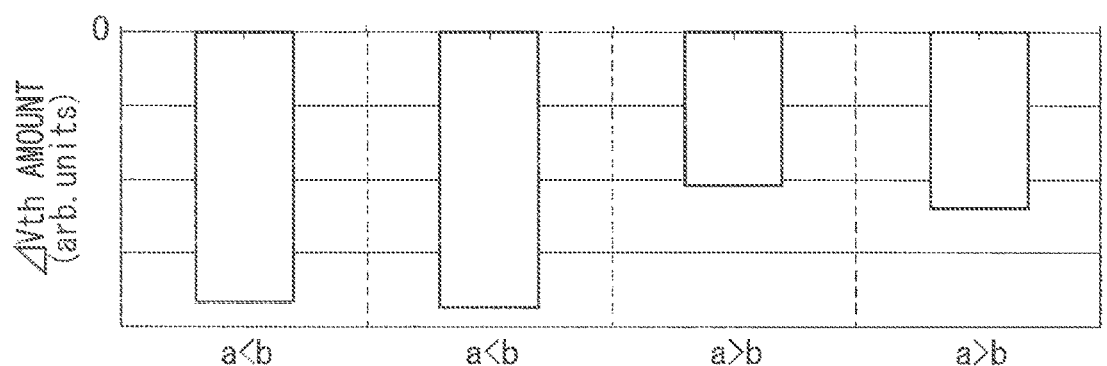
FIG. 7 illustrates the amount of shift in the negative direction of the threshold voltage under the application of light negative bias temperature stress when the overlap length a is not equal to the overlap length b.

FIG. 7 illustrates the amount of shift in the negative direction of the threshold voltage under the application of light negative bias temperature stress when the overlap length a is not equal to the overlap length b. The vertical axis in FIG. 7 indicates the amount of shift in the negative direction of the threshold voltage. The upper limit of the vertical axis is set to zero, and the vertical axis indicates a more negative shift of the voltage as it approaches its lower limit. In FIG. 7, the first two patterns from the left show cases where the overlap length a between the channel protective film 5 and the source electrode 16 is shorter than the overlap length b between the channel protective film 5 and the drain electrode 17, and the first two patters from the right show cases where the overlap length a between the channel protective film 5 and the source electrode 16 is longer than the overlap length b between the channel protective film 5 and the drain electrode 17. In FIG. 7, closer to the right side is the pattern showing the case of a longer overlap length a between the channel protective film 5 and the source electrode 16. In the case of the two patterns (a<b) from the left, the overlap length a is approximately 0.75 μm, the overlap length b is approximately 1.27 μm, and the distance c is approximately 3.5 μm. In the case of the two patterns (a>b) from the right, the overlap length a is approximately 1.27 μm, the overlap length b is approximately 0.75 μm, and the distance c is approximately 3.5 μm. A difference in the amount of shift in the negative direction of the threshold voltage between each pattern under the application of light negative bias temperature stress is within the range of error.

Reference to FIG. 7 shows that the amount of shift in the negative direction of the threshold voltage can be suppressed by setting the overlap length a between the channel protective film 5 and the source electrode 16 longer than the overlap length b between the channel protective film 5 and the drain electrode 17. Under the application of light negative bias temperature stress, a positive electrode is applied to the drain electrode 17, and holes are stored in the vicinity of the source electrode 16. Thus, it is conceivable that if the overlap length a is set longer than the overlap length b, the storage of holes in the vicinity of the source electrode 16 will be suppressed, and accordingly a shift in the negative direction of the threshold voltage will be suppressed.

Here, the distance from the region of junction between the source electrode 16 and the semiconductor layer 4 to a region where the channel is irradiated with light can be increased by increasing the overlap length a between the source electrode 16 and the channel protective film 5. That is, it is possible to inhibit the occurrence of a situation where holes excited on the channel are diffused to the vicinity of the region of junction between the source electrode 16 and the semiconductor layer 4. Accordingly, in order to suppress the storage of holes, which may lead to a shift in the threshold voltage of the thin-film transistor, it is more important to increase the overlap length between the source electrode 16 and the channel protective film 5 than it is to increase the area of overlap between the source electrode 16 and the channel protective film 5.

In the step of forming the source electrode 16 and the drain electrode 17, the precision of the distance between the source electrode 16 and the drain electrode 17, i.e., the distance c in FIGS. 2 and 3, depends on the resolving power of lithographic equipment. That is, if the overlap length a and the overlap length b increase, the channel length (a+b+c) increases. With an increase in the channel length of the thin-film transistor, the ON-state resistance of the thin-film transistor increases, and the amount of light transmission (aperture ratio) through the array substrate decreases. In view of this, if the overlap length a is made longer than the overlap length b, it is possible to suppress the storage of holes in the vicinity of the source electrode 16 and reduce the amount of shift in the negative direction of the threshold voltage under the application of light negative bias temperature stress, without increasing the sum of the overlap length a and the overlap length b.

Moreover, for example, Non-Patent Document 1 implies that electrons are stored in the region of the channel protective film 5 that overlaps with the drain electrode 17. The storage of electrons in the channel protective film 5 causes a shift in the positive direction of the threshold voltage of the thin-film transistor and degrades the reliability of the thin-film transistor. By making the overlap length b shorter, it can be expected that the region of the channel protective film 5 that overlaps with the drain electrode 17 will be reduced, and accordingly the storage of electrons in the channel protective film 5 will be suppressed.

According to the embodiment described above, in the thin-film transistor substrate, the thin-film transistor is used to drive each pixel transistor 30, which is a transistor corresponding to each pixel in the liquid crystal display. Besides, the thin-film transistor is formed on the insulating substrate 1 that is the same as the array substrate on which the pixel transistors 30 are formed.

FIG. 30 illustrates waveforms of the voltages applied to each node in FIG. 29. As illustrated in FIG. 30, the time during which a negative bias is applied to the drive transistor 20a is longer than the time during which a negative bias is applied to the drive transistor 20b. The time during which a negative bias is applied to the drive transistor 20c is longer than the time during which a negative bias is applied to the drive transistor 20b as illustrated in FIG. 30.

The power supply potential VDD is always applied to the drain electrode of the drive transistor 20c. Thus, the thin-film transistor according to the present embodiment is in particular useful when applied as the drive transistor 20c. In other words, the advantageous effects of the present embodiment can be achieved if the thin-film transistor according to the present embodiment is applied to at least the drive transistor 20c.

With this configuration in which the semiconductor layer 4 is used as a channel layer, the transistor can be made more compact thanks to high carrier mobility. Thus, if the scanning signal driving circuit 25 and the display signal driving circuit 26 are prepared using the drive transistors 20 that use an oxide semiconductor as their channel layers, the scanning signal driving circuit 25a and the display signal driving circuit 26 can be made more compact and can be housed within the frame area 23 of the array substrate 100. Accordingly, it is possible to reduce the cost of the driving circuits and to narrow the frame area 23.

According to the embodiment described above, the liquid crystal display includes the array substrate 100 which is a thin-film transistor substrate, the color filter 102 which is an opposite substrate disposed opposite the array substrate 100, a liquid crystal layer 400 sandwiched between the array substrate 100 and the color filter 102, and the backlight 104 disposed on the side of the array substrate 100 opposite the color filter 102.

This configuration can suppress the storage of holes under the application of light negative bias temperature stress of light from the backlight 104.

While constituent elements other than those described above may be appropriately omitted, the advantageous effects described above can also be achieved even in the case where at least one of the other constituent elements described in the specification of the present invention is appropriately added.

In the case of using thin-film transistors in the depletion mode, large ON-state current can be obtained at low gate voltages. In the case of using thin-film transistors in the normal mode or in the enhancement mode, VSS may be a ground potential. In this case, it is no longer necessary to use a negative power supply for VSS, and it is possible to simplify the power supply configuration of the liquid crystal display.

Second Embodiment

<Configuration>

A transistor, a thin-film transistor substrate, and a liquid crystal display according to another embodiment of the present invention will now be described. In the following description, constituent elements that are similar to those described in the above embodiment are given the same reference numerals, and redundant description thereof may be appropriately omitted.

Figure 31:
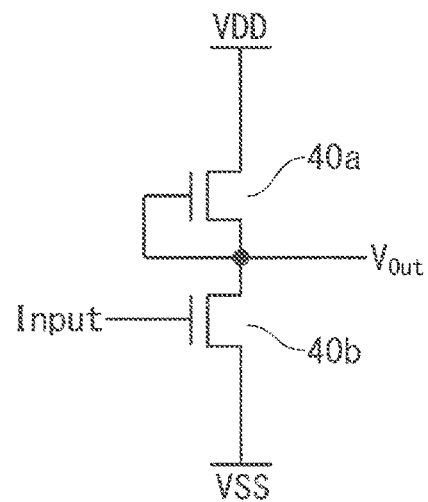
FIG. 31 illustrates a configuration of an inverter circuit according to an embodiment.

In the present embodiment, a driving circuit includes an inverter circuit as illustrated in FIG. 31. The inverter circuit includes a drive transistor 40a and a drive transistor 40b as illustrated in FIG. 31.

A power supply potential VDD is connected to a drain electrode of the drive transistor 40a. A source electrode of the drive transistor 40a is connected to a gate electrode of the drive transistor 40a and to a drain electrode of the drive transistor 40b.

A source electrode of the drive transistor 40b is connected to a power supply potential VSS. A gate electrode of the drive transistor 40b is connected to Input.

When no voltage is applied to Input, i.e., when Input is in the OFF state. Vout is in the ON state. When a voltage is applied to Input, i.e., when Input is in the ON state, Vout is in the OFF state. Note that at least the drive transistor 40a uses the thin-film transistor illustrated in the first embodiment.

Advantageous Effects

When a voltage is applied to Input, i.e., when Input is in the ON state, the power supply potential VSS, which is a negative bias, is applied to the gate electrode of the drive transistor 40a. This voltage application reduces the threshold voltage of the drive transistor 40a and degrades the reliability thereof under the application of light negative bias temperature stress (i.e., LNBTS).

In view of this, the thin-film transistor illustrated in the first embodiment is used as the drive transistor 40a in order to suppress a reduction in the threshold voltage of the transistor and improve the reliability thereof.

Third Embodiment

<Configuration>

A transistor, a thin-film transistor substrate, and a liquid crystal display according to another embodiment of the present invention will now be described. In the following description, constituent elements that are similar to those described in the above embodiment are given the same reference numerals, and redundant description thereof may be appropriately omitted.

Figure 32:
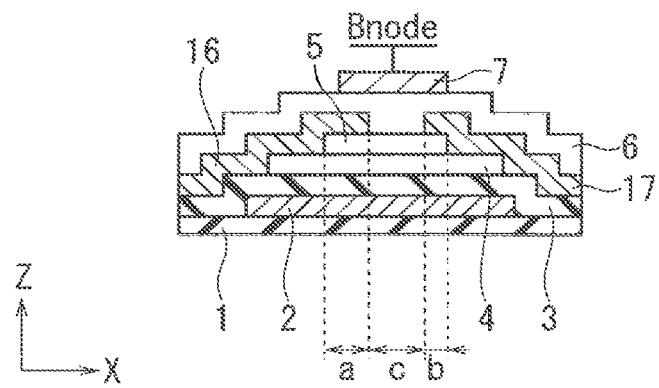
FIG. 32 illustrates a cross-sectional structure of a thin-film transistor according to an embodiment.

FIG. 32 illustrates a cross-sectional structure of a thin-film transistor according to the present embodiment. The thin-film transistor includes an insulating substrate 1, a gate electrode 2, a gate insulating film 3, a semiconductor layer 4, a channel protective film 5, a source electrode 16, and a drain electrode 17 as illustrated in FIG. 32.

The thin-film transistor additionally includes a protective film 6 that covers the source electrode 16, the drain electrode 17, the channel protective film 5, and the gate insulating film 3.

Conceivable examples of the material for the protective film 6 include SiO, SiN, and AlO. The protective film 6 may have a film thickness that is greater than or equal to 50 nm and less than or equal to 500 nm.

A top gate electrode 7 is formed in a position on the upper surface of the protective film 6, the position overlapping with the semiconductor layer 4 in plan view. Conceivable examples of the material for the top gate electrode 7 include Al, Mo, Ti, Cu, and Ta. Other conceivable examples of the material for the top gate electrode 7 include ITO for transparent electrode and IZO. The top gate electrode 7 may have a thickness greater than or equal to 5 nm and less than or equal to 500 nm.

Figure 33:
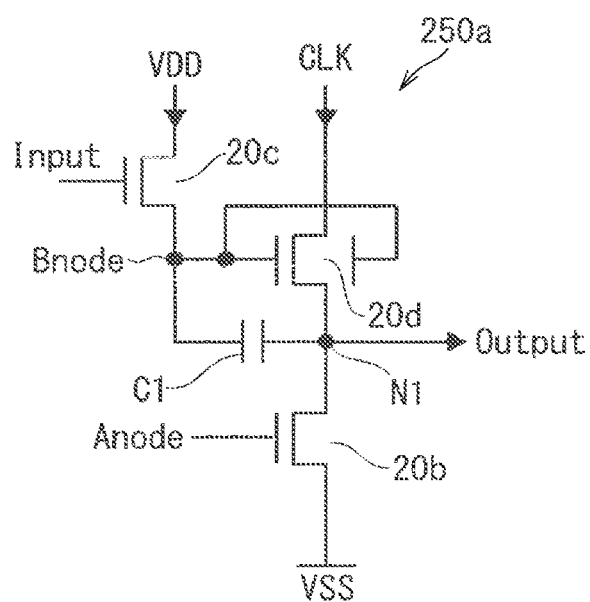
FIG. 33 schematically illustrates a configuration of a driving voltage generating circuit according to an embodiment.

FIG. 33 schematically illustrates a configuration of a driving voltage generating circuit according to the present embodiment. The configuration illustrated in FIG. 32 corresponds to a drive transistor 20d in FIG. 33. Here, the top gate electrode 7 in FIG. 32 is connected to Bnode in FIG. 33.

A driving voltage generating circuit 250a includes the drive transistor 20d having a drain that receives application of a clock signal CLK, a drive transistor 20b having a source that receives application of a power supply potential VSS and having a drain connected to a source of the drive transistor 20d, and a drive transistor 20c having a drain that receives application of a power supply potential VDD and having a source connected to a gate of the drive transistor 20d. The driving voltage generating circuit 250a further includes a capacitor C1. The capacitor C1 has one electrode connected to the source of the drive transistor 20d. The other electrode of the capacitor C1 is connected to a gate electrode of the drive transistor 20d and to a source electrode of the drive transistor 20c.

Advantageous Effects

The presence of the top gate electrode 7 on the channel of the thin-film transistor and the application of a negative bias to the top gate electrode 7 cause a positive shift in the threshold voltage of the thin-film transistor. This has been reported in "T.-Y. Hsieh, et. al., IEEE Transactions on Electron Devices., vol. 60, no. 5, p 1681 (2013)."

When the top gate electrode 7 is formed in the drive transistor 20d and then a voltage at Bnode is connected to the top gate electrode 7 as described and illustrated in the present embodiment, a negative bias is applied to the top gate electrode 7 during the OFF state of the drive transistor 20d.

At this time, the threshold voltage of the drive transistor 20d shifts positively, which can suppress OFF-state current, i.e., leakage current. In this case, the stability of the display improves because malfunctions in the drive transistor can be prevented by suppressing leakage current in the drive transistor.

Moreover, the reliability of the TfT can be improved by applying a gate bias to the top gate electrode 7. This has been reported in "K. Chang, et. al., SID'15 Digest, p. 1023 (2015)".

Accordingly, the reliability of the display can be improved by applying a gate bias to the top gate electrode 7 on the semiconductor layer 4 as described and illustrated in the present embodiment.

Fourth Embodiment

<Configuration>

A transistor, a thin-film transistor substrate, and a liquid crystal display according to another embodiment of the present invention will now be described. In the following description, constituent elements that are similar to those described in the above embodiment are given the same reference numerals, and redundant description thereof may be appropriately omitted.

Figure 21:
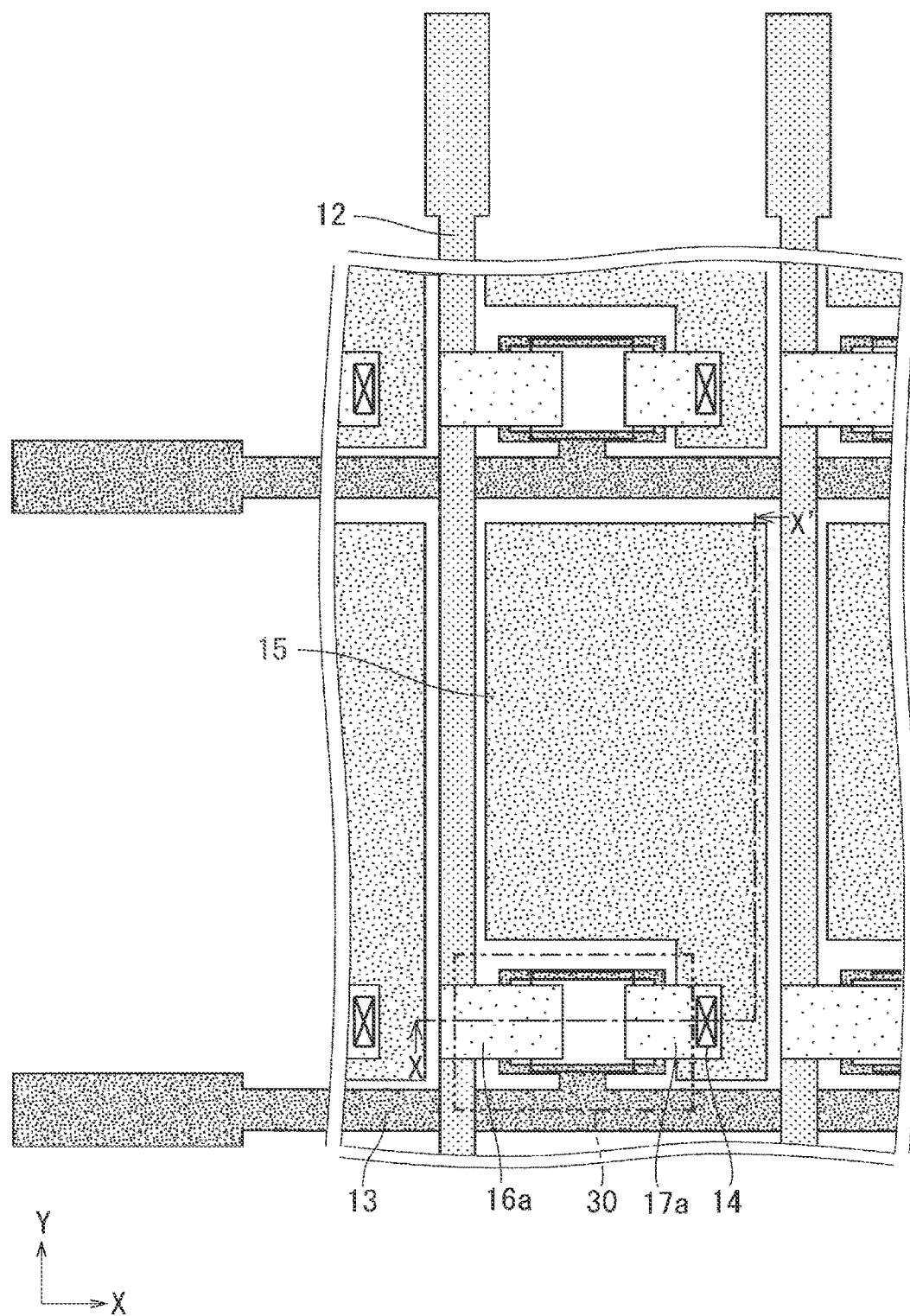
FIG. 21 is a plan view illustrating a configuration of a portion that corresponds to a pixel in an array substrate according to an embodiment.
Figure 22:
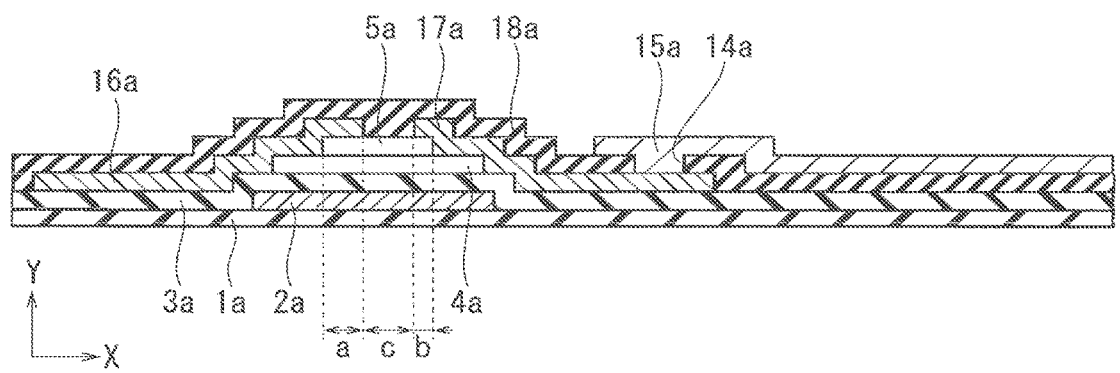
FIG. 22 is a cross-sectional view illustrating a cross-sectional configuration taken along line X-X' in FIG. 21.

FIG. 21 is a plan view illustrating a configuration of a portion that corresponds to a pixel in an array substrate according to an embodiment of the present invention. FIG. 22 is a cross-sectional view of a cross-sectional configuration taken along line X-X' in FIG. 21. Although the following description assumes that the array substrate is used in a liquid crystal display that employs the TN mode, the array substrate may be used in liquid crystal displays that employ the IPS or FFS mode.

As illustrated in FIG. 21, the array substrate according to the present embodiment differs from the array substrate 100 described in the first embodiment in that the thin-film transistor as described in the first embodiment is also applied to the pixel transistors 30, the thin-film transistor being configured such that the overlap length a in the x direction between the source electrode and the channel protective film is longer than the overlap length b in the x direction between the drain electrode and the channel protective film. Note that a source electrode 16a and a drain electrode 17a of a pixel transistor 30 are respectively assumed to be an electrode that is connected to a source line (display signal line) 12 and an electrode that is connected to a pixel electrode 15. Alternatively, a case is also possible in which the thin-film transistor as described in the first embodiment is applied to only the pixel transistors 30, the thin-film transistor being configured such that the overlap length a in the x direction between the source electrode and the channel protective film is longer than the overlap length b in the x direction between the drain electrode and the channel protective film. The source electrode of the thin-film transistor for each pixel is formed of a source line 12 extending in the y direction as illustrated in FIG. 21.

As illustrated in FIG. 22, the thin-film transistor includes a transparent insulating substrate 1a such as glass and a gate electrode 2a formed on part of the insulating substrate 1a.

The thin-film transistor also includes a gate insulating film 3a formed to cover the insulating substrate 1a and the gate electrode 2a. The thin-film transistor also includes a semiconductor layer 4a formed on part of the gate insulating film 3a. The semiconductor layer 4a overlaps with the gate electrode 2a in plan view. Note that the semiconductor layer 4a may lie off the area of overlap with the gate electrode 2a in plan view.

The thin-film transistor also includes a channel protective film 5a formed on part of the semiconductor layer 4a. The channel protective film 5a is formed on a region that serves as a channel region during operations of the thin-film transistor.

The thin-film transistor also includes the source electrode 16a and the drain electrode 17a that are formed to cover part of the channel protective film 5a, the semiconductor layer 4a, and the gate insulating film 3a. The source electrode 16a and the drain electrode 17a are spaced from each other.

The thin-film transistor further includes a protective insulation film 18a formed to cover part of the drain electrode 17a, the source electrode 16a, the channel protective film 5a, and the gate insulating film 3a. The thin-film transistor also includes a pixel electrode 15a formed to cover the protective insulation film 18a.

The protective insulation film 18a has a contact hole 14a through which the pixel electrode 15a and the drain electrode 17a are electrically connected to each other.

<Manufacturing Method>

A process of manufacturing the thin-film transistor of the liquid crystal display according to the present embodiment will now be described hereinafter with reference to FIGS. 23 to 28. FIGS. 23 to 28 are cross-sectional views illustrating a structure of the liquid crystal display in each manufacturing step. The structure illustrated in FIG. 22 corresponds to a cross-sectional view in the final step.

Figure 23:
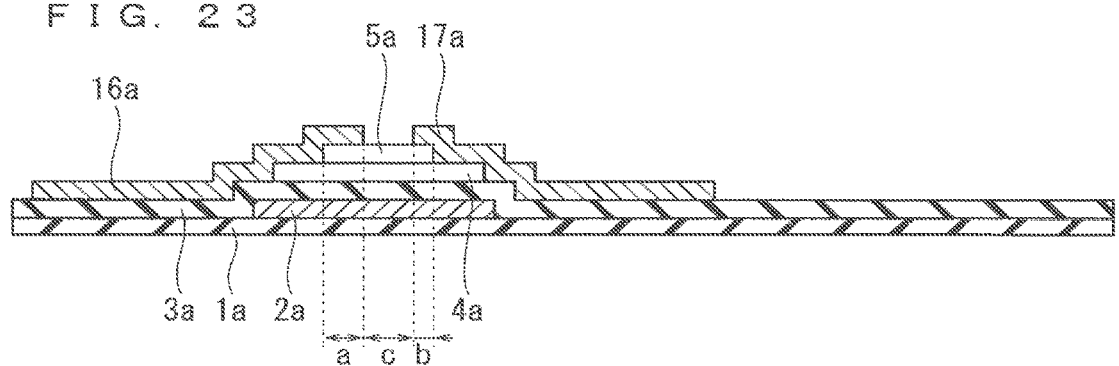
FIG. 23 is a cross-sectional view illustrating a structure of the liquid crystal display at each manufacturing step in the process of manufacturing the thin-film transistor of the liquid crystal display according to an embodiment (preparation of a thin-film transistor).

First, as with the case described in the first embodiment, a thin-film transistor in which the overlap length a between the source electrode 16a and the channel protective film 5a is longer than the overlap length b between the drain electrode 17a and the channel protective film 5a is prepared as illustrated in FIG. 23. Here, the source electrode 16a of the thin-film transistor illustrated in FIG. 23 is formed simultaneously with a source line 12 by forming the resist pattern 304 illustrated in FIG. 20 even in a region that later forms the source line 12.

Figure 24:
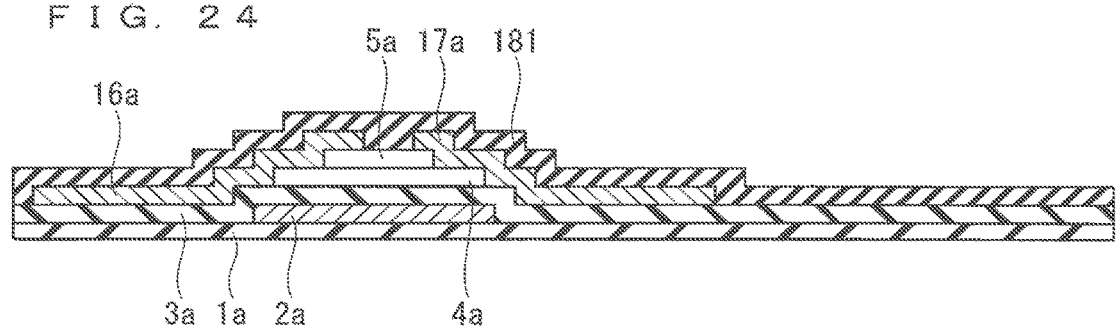
FIG. 24 is a cross-sectional view illustrating a structure of the liquid crystal display at each manufacturing step in the process of manufacturing the thin-film transistor of the liquid crystal display according to the embodiment (formation of a silicon oxide film).

Next, a silicon oxide film 181 that covers the source electrode 16a, the drain electrode 17a, the channel protective film 5a, the source line 12 (not shown herein), and the gate insulating film 3a is formed as illustrated in FIG. 24. The silicon oxide film 181 functions as a protective insulation film in the thin-film transistor.

The silicon oxide film 181 may be formed to a thickness ranging from, for example, approximately 50 nm to 500 nm by plasma CVD using silane ($SiH_4$) gas and nitrous oxide ($N_2O$) gas.

Figure 25:
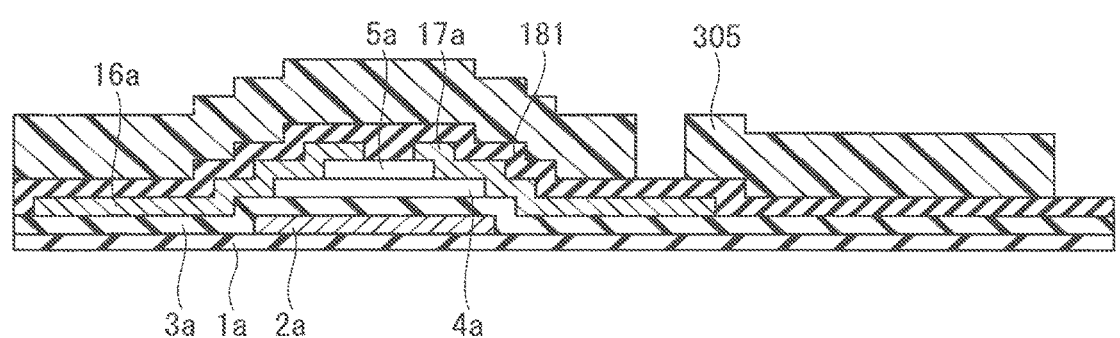
FIG. 25 is a cross-sectional view illustrating a structure of the liquid crystal display at each manufacturing step in the process of manufacturing the thin-film transistor of the liquid crystal display according to the embodiment (formation of a resist pattern).

Next, a photoresist is formed on the silicon oxide film 181 and patterned in a photolithographic process to form a resist pattern 305 as illustrated in FIG. 25. The photoresist may be formed by applying a photoresist material made of, for example, a novolac-based, positive-type photosensitive resin to the silicon oxide film 181 by coating. The photoresist may have a thickness of approximately 1.5 μm.

Figure 26:
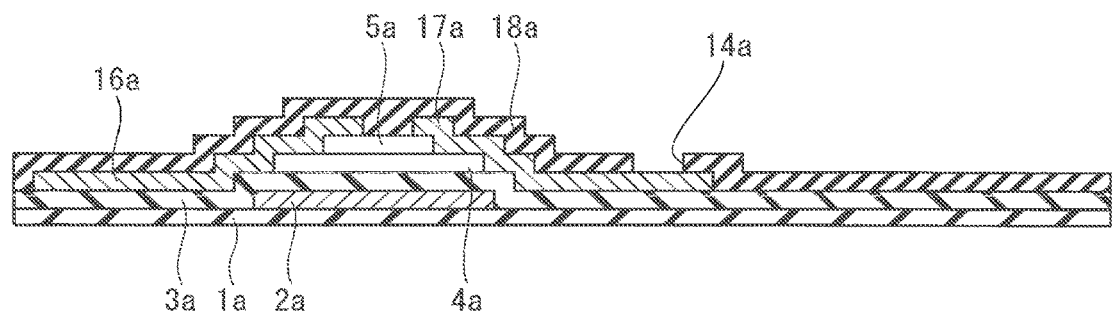
FIG. 26 is a cross-sectional view illustrating a structure of the liquid crystal display at each manufacturing step in the process of manufacturing the thin-film transistor of the liquid crystal display according to the embodiment (formation of a protective insulation film and a contact hole).

Next, using the resist pattern 305 as an etching mask, the silicon oxide film 181 is etched by dry etching using gas that contains fluorine such as $CHF_3$, $CF_4$, or $SF_6$ and oxygen ($O_2$) gas as illustrated in FIG. 26. As a result, the protective insulation film 18a and the contact hole 14a are formed. Next, the resist pattern 305 is stripped off and removed using an amine-based resist stripper.

Figure 27:
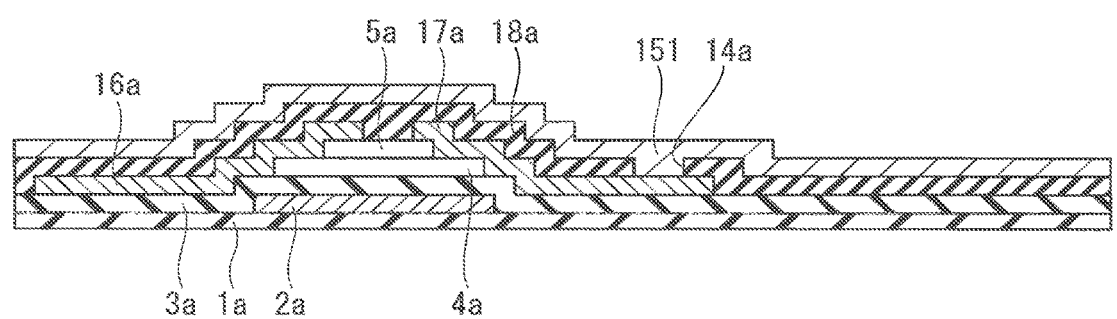
FIG. 27 is a cross-sectional view illustrating a structure of the liquid crystal display at each manufacturing step in the process of manufacturing the thin-film transistor of the liquid crystal display according to the embodiment (deposition of a transparent conductive film).

Next, a transparent conductive film 151 that covers the protective insulation film 18a and the contact hole 14a is deposited as illustrated in FIG. 27. The transparent conductive film 151 may be an a-ITO film formed by DC sputtering using an ITO target that contains indium oxide and tin oxide. The transparent conductive film 151 may have a thickness of 100 nm.

Figure 28:
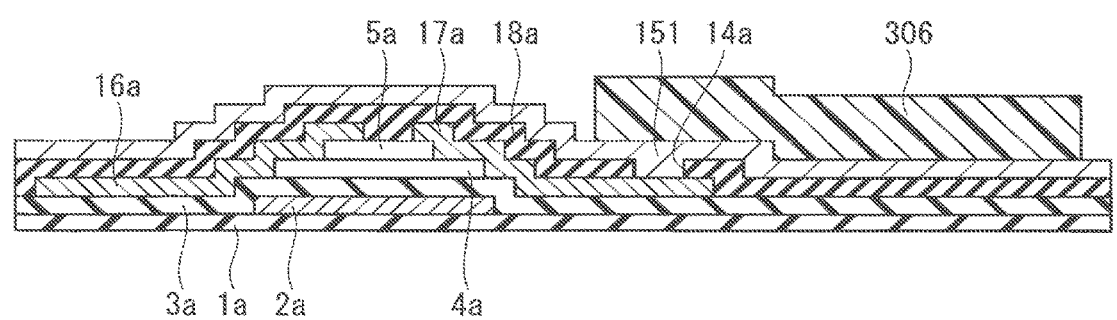
FIG. 28 is a cross-sectional view illustrating a structure of the liquid crystal display at each manufacturing step in the process of manufacturing the thin-film transistor of the liquid crystal display according to the embodiment (formation of a resist pattern).

Next, a photoresist is formed on the transparent conductive film 151 and patterned in a photolithographic process to form a resist pattern 306 as illustrated in FIG. 28. The photoresist may be formed by applying a photoresist material made of, for example, a novolac-based, positive-type photosensitive resin to the transparent conductive film 151 by coating. The photoresist may have a thickness of approximately 1.5 μm.

Then, using the resist pattern 306 as an etching mask, the transparent conductive film 151 is etched by wet etching using a PAN-based solution. As a result, the pixel electrode 15 is formed. In this way, the thin-film transistor illustrated in FIG. 22 is obtained.

Advantageous Effects

According to the embodiment described above, the transistor includes the gate electrode 2a, the gate insulating film 3a, the semiconductor layer 4a which is an oxide semiconductor layer, the channel protective film 5a, the source electrode 16a, and the drain electrode 17a.

The gate insulating film 3a covers at least the gate electrode 2a. The semiconductor layer 4a is formed in a position on the gate insulating film 3a, the position including a position overlapping with the gate electrode 2a in plan view.

The channel protective film 5a covers part of the semiconductor layer 4a. The source electrode 16a covers part of the channel protective film 5a and the semiconductor layer 4a. The drain electrode 17a is spaced from the source electrode 16a and covers part of the channel protective film 5a and the semiconductor layer 4a.

Moreover, the overlap length a is longer than the overlap length b, the overlap length a being a length of overlap in plan view between the source electrode 16a and the channel protective film 5a in a direction from the source electrode 16a toward the drain electrode 17a, and the overlap length b being a length of overlap in plan view between the drain electrode 17a and the channel protective film 5a in the direction from the source electrode 16a toward the drain electrode 17a.

With this configuration, it is possible to suppress a shift in the negative direction of the threshold value under the application of light negative bias temperature stress, without increasing the size of the transistor, because the overlap length a (the length of overlap in plan view between the source electrode 16a and the channel protective film 5a) is longer than the overlap length b (the length of overlap in plan view between the drain electrode 17a and the channel protective film 5a). Besides, a shift in the positive direction of the threshold value can be suppressed because the storage of electrons in the channel protective film Sa is suppressed.

While constituent elements other than those described above may be appropriately omitted, the advantageous effects described above can also be achieved even in the case where at least one of the other constituent elements described in the specification of the present invention is appropriately added.

According to the embodiment described above, the thin-film transistor is used as the pixel transistors 30 on the thin-film transistor substrate, the pixel transistors 30 being transistors corresponding to pixels in the liquid crystal display. The thin-film transistor substrate is an array substrate on which the pixel transistors 30 are formed.

This configuration can reduce the area of overlap between the gate electrode 2a and the drain electrode 17a. It is thus possible to reduce parasitic capacitance, which may be a cause of pixel burn-in or unevenness in display.

According to the embodiment described above, a plurality of thin-film transistors on the thin-film transistor substrate include transistors that are used to drive the pixel transistors 30, which are transistors corresponding to pixels in the liquid crystal display, and transistors that are used as the pixel transistors 30. The thin-film transistor substrate is an array substrate on which the pixel transistors 30 are formed. The thin-film transistors used to drive the pixel transistors 30 are formed on the insulating substrate 1a that is the same as the thin-film transistor substrate.

With this configuration in which the semiconductor layer 4 is used as a channel layer, the transistor can be made more compact thanks to high carrier mobility. Thus, if the scanning signal driving circuit 25 and the display signal driving circuit 26 are prepared using the drive transistors 20 that use an oxide semiconductor as their channel layers, the scanning signal driving circuit 25 and the display signal driving circuit 26 can be made more compact and can be housed within the frame area 23 of the array substrate. Accordingly, it is possible to reduce the cost of the driving circuits and to narrow the frame area 23.

Besides, the area of overlap between the gate electrode 2a and the drain electrode 17a can be reduced. It is thus possible to reduce parasitic capacitance, which may be a cause of pixel burn-in or unevenness in display.

Variations

While features such as materials, properties of the materials, dimensions, shapes, and relative locations and positioning of constituent elements or conditions for implementation may be described in the embodiments described above, they are all illustrative in all aspects and are not limited to those described in the specification of the present invention. Thus, numeral variations that are not described and illustrated are assumed to fall within the scope of the technique of the present invention. Examples include cases where at least one constituent element is modified, added, or omitted and where at least one constituent element in at least one embodiment is extracted and combined with constituent elements of another embodiment.

In the embodiments described above, "one" constituent element may include "one or more" constituent elements as long as no contradiction arises. Moreover, each constituent element may be perceived as a conceptual unit, and the present invention may include cases where one constituent element includes a plurality of structural elements, where one constituent element corresponds to part of a structural element, and where a plurality of constituent elements are included in one structural element. Each constituent element may include structural elements having other structures or shapes as long as its function remains unchanged.

The description in the specification of the present invention shall be referred to for all purposes relating to the technique of the present invention, and nothing in the specification shall be regarded as conventional technology.

When features such as the names of materials are described with no particular specification in the embodiments described above, those materials may include other additives such as an alloy, as long as no contradiction arises.

EXPLANATION OF REFERENCE SIGNS 1, 1a: Insulating substrate, 2, 2a: Gate electrode, 3, 3a: Gate insulating film. 4, 4a, 41: Semiconductor layer, 5, 5a: Channel protective film, 6: Protective film, 7: Top gate electrode, 12: Source line, 13: Gate line, 14a: Contact hole, 15, 15a: Pixel electrode, 16, 16a: Source electrode, 17, 17a: Drain electrode, 18a: Protective insulation film, 20, 20a, 20b, 20c, 20d, 40a, 40b: Drive transistor, 21, 61: Metal film, 23: Frame area, 24: Display area, 25: Scanning signal driving circuit, 26: Display signal driving circuit, 30: Pixel transistor, 51, 181: Silicon oxide film. 100: Array substrate, 101a, 101b: Polarizing plate, 102: Color filter, 104: Backlight, 151: Transparent conductive film, 250, 250a: Driving voltage generating circuit, 301, 302, 303, 304, 305, 306: Resist pattern, 400: Liquid crystal layer, C1: Capacitor, N1: Output node, a, b: Overlap length, c: Distance, P, Q: Region

The invention claimed is:

1. A thin-film transistor substrate that is a thin-film transistor substrate including a transistor including:
   a gate electrode;
   a gate insulating film that covers at least said gate electrode;
   an oxide semiconductor layer formed in a position on said gate insulating film, the position including a position that overlaps with said gate electrode in plan view;
   a channel protective film that covers part of said oxide semiconductor layer;
   a source electrode that covers part of said channel protective film and part of said oxide semiconductor layer; and
   a drain electrode that is spaced from said source electrode and covers part of said channel protective film and part of said oxide semiconductor layer,
   wherein a length of overlap in plan view between said source electrode and said channel protective film in a direction from said source electrode toward said drain electrode is longer than a length of overlap in plan view between said drain electrode and said channel protective film in a direction from said drain electrode toward said source electrode,
   said transistor is used in a circuit that drives a pixel transistor that is a transistor corresponding to a pixel in a liquid crystal display,
   said circuit that drives the pixel transistor includes a first transistor, a second transistor, a third transistor, and a capacitor,
   said first transistor has a source electrode connected to one electrode of said capacitor and to a drain electrode of said second transistor,
   said capacitor has the other electrode connected to a gate electrode of said first transistor and to a source electrode of the third transistor,
   at least said third transistor is the transistor, and
   said transistor is formed on a substrate that is the same as said thin-film transistor substrate that is an array substrate on which said pixel transistor is formed.

2. The transistor according to claim 1, wherein said oxide semiconductor layer is formed on the inner side of said gate electrode in plan view.

3. The transistor according to claim 1, operating in a depletion mode in which a threshold voltage is negative.

4. A thin-film transistor substrate that is a thin-film transistor substrate including a transistor including:
a gate electrode;
a gate insulating film that covers at least said gate electrode;
an oxide semiconductor layer formed in a position on said gate insulating film, the position including a position that overlaps with said gate electrode in plan view;
a channel protective film that covers part of said oxide semiconductor layer;
a source electrode that covers part of said channel protective film and part of said oxide semiconductor layer; and
a drain electrode that is spaced from said source electrode and covers part of said channel protective film and part of said oxide semiconductor layer,
wherein a length of overlap in plan view between said source electrode and said channel protective film in a direction from said source electrode toward said drain electrode is longer than a length of overlap in plan view between said drain electrode and said channel protective film in a direction from said drain electrode toward said source electrode,
said transistor is used in an inverter circuit that drives a pixel transistor that is a transistor corresponding to a pixel in a liquid crystal display,
said inverter circuit that drives the pixel transistor includes a first transistor and a second transistor,
said first transistor has a source electrode connected to a gate electrode of said first transistor and to a drain electrode of said second transistor,
said second transistor has a source electrode connected to a power supply potential VSS,
at least said first transistor is the transistor, and
said transistor is formed on a substrate that is the same as said thin-film transistor substrate that is an array substrate on which said pixel transistor is formed.

5. A thin-film transistor substrate that is a thin-film transistor substrate including a transistor including:
a gate electrode;
a gate insulating film that covers at least said gate electrode;
an oxide semiconductor layer formed in a position on said gate insulating film, the position including a position that overlaps with said gate electrode in plan view;
a channel protective film that covers part of said oxide semiconductor layer;
a source electrode that covers part of said channel protective film and part of said oxide semiconductor layer; and
a drain electrode that is spaced from said source electrode and covers part of said channel protective film and part of said oxide semiconductor layer,
wherein a length of overlap in plan view between said source electrode and said channel protective film in a direction from said source electrode toward said drain electrode is longer than a length of overlap in plan view between said drain electrode and said channel protective film in a direction from said drain electrode toward said source electrode,
said transistor further comprises:
an additional protective film formed to cover said source electrode, said drain electrode, said channel protective film, and said gate insulating film; and
a top gate electrode formed in a position on an upper surface of said additional protective film, the position overlapping with said oxide semiconductor layer in plan view,
said transistor is used in a circuit that drives a pixel transistor that is a transistor corresponding to a pixel in a liquid crystal display,
said circuit that drives the pixel transistor includes a first transistor, a second transistor, a third transistor, and a capacitor,
said first transistor has a source electrode connected to one electrode of said capacitor and to a drain electrode of said second transistor,
said capacitor has the other electrode connected to a gate electrode of said first transistor and to a source electrode of the third transistor,
at least said first transistor is the transistor,
said top gate electrode of said first transistor is connected to said gate electrode of said first transistor, and
said transistor is formed on a substrate that is the same as said thin-film transistor substrate that is an array substrate on which said pixel transistor is formed.

6. A liquid crystal display comprising:
a thin-film transistor substrate including a transistor including:
a gate electrode;
a gate insulating film that covers at least said gate electrode;
an oxide semiconductor layer formed in a position on said gate insulating film, the position including a position that overlaps with said gate electrode in plan view;
a channel protective film that covers part of said oxide semiconductor layer;
a source electrode that covers part of said channel protective film and part of said oxide semiconductor layer; and
a drain electrode that is spaced from said source electrode and covers part of said channel protective film and part of said oxide semiconductor layer,
wherein a length of overlap in plan view between said source electrode and said channel protective film in a direction from said source electrode toward said drain electrode is longer than a length of overlap in plan view between said drain electrode and said channel protective film in a direction from said drain electrode toward said source electrode,
said transistor is used in a circuit that drives a pixel transistor that is a transistor corresponding to a pixel in a liquid crystal display,
said circuit that drives the pixel transistor includes a first transistor, a second transistor, a third transistor, and a capacitor,
said first transistor has a source electrode connected to one electrode of said capacitor and to a drain electrode of said second transistor,
said capacitor has the other electrode connected to a gate electrode of said first transistor and to a source electrode of the third transistor,
at least said third transistor is the transistor, and
said transistor is formed on a substrate that is the same as said thin-film transistor substrate that is an array substrate on which said pixel transistor is formed;
an opposite substrate disposed opposite said thin-film transistor substrate;

a liquid crystal layer that is sandwiched between said thin-film transistor substrate and said opposite substrate; and a backlight disposed on a side of said thin-film transistor substrate opposite said opposite substrate.

* * * * *